(12) United States Patent
Honda et al.

(10) Patent No.: US 6,798,031 B2
(45) Date of Patent: Sep. 28, 2004

(54) SEMICONDUCTOR DEVICE AND METHOD FOR MAKING THE SAME

(75) Inventors: Toshiyuki Honda, Kawasaki (JP); Kazuto Tsuji, Kawasaki (JP); Masanori Onodera, Kawasaki (JP); Hiroshi Aoki, Kawasaki (JP); Izumi Kobayashi, Kawasaki (JP); Susumu Moriya, Kawasaki (JP); Hiroshi Kaiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 22 days.

(21) Appl. No.: 10/107,481

(22) Filed: Mar. 28, 2002

(65) Prior Publication Data

US 2003/0071342 A1 Apr. 17, 2003

Related U.S. Application Data

(63) Continuation-in-part of application No. 10/012,455, filed on Dec. 12, 2001.

(30) Foreign Application Priority Data

| Oct. 12, 2001 | (JP) | 2001-315672 |
| Feb. 21, 2002 | (JP) | 2002-044322 |
| Feb. 28, 2002 | (JP) | 2001-055735 |

(51) Int. Cl.[7] .......................... H01L 31/0203
(52) U.S. Cl. ................ 257/433; 257/787; 257/778; 257/434; 438/127
(58) Field of Search ................ 257/686, 787, 257/666, 778, 777, 431, 432, 433, 434, 680; 438/108, 116, 125, 126, 127

(56) References Cited

U.S. PATENT DOCUMENTS

| 5,523,608 | A | * | 6/1996 | Kitaoka et al. |
| 5,821,532 | A | * | 10/1998 | Beaman et al. |
| 6,316,838 | B1 | * | 11/2001 | Ozawa et al. |
| 6,380,629 | B1 | * | 4/2002 | Kim |
| 6,476,417 | B2 | * | 11/2002 | Honda et al. |

* cited by examiner

*Primary Examiner*—Sheila V. Clark
(74) *Attorney, Agent, or Firm*—Armstrong, Kratz, Quintos, Hanson & Brooks, LLP

(57) ABSTRACT

A semiconductor device includes a resin housing provided with a functional part, a wire pattern made of a conductive material and molded in the resin housing, a part of the wire pattern being exposed from the resin housing, an electronic part connected with the wire pattern in a state where the electronic parts is molded in the resin housing, and a semiconductor element connected to the part of the wire pattern being exposed from the resin housing. The semiconductor element provides a designated function in cooperation with a functional part of the resin housing.

42 Claims, 44 Drawing Sheets

SEMICONDUCTOR DEVICE AND METHOD FOR MAKING THE SAME

This application is a continuation-in-part of prior application Ser. No. 10/012,455 filed Dec. 12, 2001. Abandon application Ser. No. 10/012,455 in favor of this continuation-in-part application.

BACKGROUND OF THE INVENTION

1. Field of the Invention

The present invention generally relates to semiconductor devices, and more particularly, to a semiconductor device, which unifies a light receiving element and a lens for photographing as a package, and is suitable for photographing.

2. Description of the Related Art

Recently, a cellular phone and a mobile personal computer in which a small sized camera is built have been developed. For instance, it is possible to take a picture of a person using the cellular phone by the small sized camera built in the cellular phone, so as to take a picture in the cellular phone as image data, and to transmit the image data to an opponent of the person. Such a small sized camera generally comprises a C-MOS sensor and a lens. There is a demand for miniaturizing the small sized camera for the cellular phone as well as miniaturizing the cellular phone and the mobile personal computer. A semiconductor device package formed by unifying the light receiving element and the lens has been developed to meet the demand for miniaturizing such the small sized camera.

FIG. 1 is a cross-sectional view showing a conventional semiconductor device package unifying a lens for photographing and a semiconductor chip having the C-MOS sensor. In the semiconductor device package shown in FIG. 1, a semiconductor chip 1 having a C-MOS sensor is mounted on a printed circuit board 2 which is rigid and wire-bonded to a pattern wire 2a of the printed circuit board 2, in a state where a light-receiving surface 1a of the chip 1 is top.

A lens 3 for photographing is attached to a housing 4. The housing 4 is fixed on the printed circuit board 2 in a state where the lens 3 is arranged in a designated position above the light-receiving surface 1a of the chip 1. Therefore, the semiconductor device package for the small-sized camera shown in FIG. 1 has a structure where the semiconductor chip is mounted on the board and the lens is arranged above the chip. Further, an IR filter 5 is arranged between the lens 3 and the semiconductor chip 1.

A positioning pin 6 is formed on a base of the housing 4. The housing 4 is precisely positioned on the printed circuit board 2 by inserting the pin 6 in a positioning hole 7 provided in the printed circuit board 2. Thus, it can be carried out to position the lens 3 attached to the housing 4 relative to the semiconductor chip 1 which is mounted on the printed circuit board 2.

In the semiconductor device package having the above-mentioned structure, another printed circuit board 8 is arranged under the printed circuit board 2 in a case where an electronic part 9 such as a capacitor, resistor, and the like is mounted. That is, the printed circuit board 2 having the semiconductor chip 1 and the housing 4 is mounted on the printed circuit board 8, and the electronic part 9 is mounted on the printed circuit board 8.

However, the above-mentioned conventional semiconductor device package has the following disadvantages due to its structure.

First of all, referring to FIG. 2 which is a plan view showing an arrangement of parts of the semiconductor device package of FIG. 1, the electronic part 9 is arranged outside of the printed circuit board 2 on which the semiconductor chip 1 and the housing 4 are mounted, in a case where the electronic parts 9 are mounted on the printed circuit board 8. Accordingly, the printed circuit board 8 is bigger than the printed circuit board 2, so that the size of the entire semiconductor package is increased.

Secondly, as to a manufacturing process of the semiconductor chip having a light-receiving element, a back of the semiconductor chip 1 is ground by a grinder in order to reduce a thickness of the semiconductor chip 1.

Therefore, the thickness of the semiconductor chip 1 fluctuates on an individual wafer basis. A range of the fluctuation is normally between plus 15 μm and minus 15 μm and an allowable range of the fluctuation is between about plus 30 μm and minus 30 μm.

In case of that the thickness of the semiconductor chip 1 is fluctuated, a distance between a light-receiving surface 1a of the semiconductor chip 1 and the lens 3 is also fluctuated.

The lens 3 is arranged at a designated distance from the surface of the printed circuit board 2 and the light-receiving surface 1a is arranged at the distance corresponding to the thickness of the semiconductor chip 1 from the surface of the printed circuit board 2. Therefore, the light-receiving surface 1a of the semiconductor chip 1 approaches the lens 3 when the thickness of the semiconductor chip 1 is increased. The light-receiving surface 1a of the semiconductor chip 1 is remote from the lens 3 when the thickness of the semiconductor chip 1 is decreased.

The distance between the lens 3 and the light-receiving surface 1a of the semiconductor chip 1 is set equal to a focal length of the lens 3, so that a picture taken by the lens 3 is formed on the light-receiving surface 1a precisely. Accordingly, if the distance between the light-receiving surface 1a and the lens 3 is fluctuates as described above, there is a problem in that an unfocused state happens and the picture is out of focus.

Thirdly, in case of that the semiconductor chip 1 is mounted on the printed circuit board 2, the semiconductor chip 1 is glued and fixed on a surface of the printed circuit board 2 by a die apparatus.

The die apparatus holds the semiconductor chip 1 by suctioning the surface of the semiconductor chip 1, namely a face on which the light-receiving element is formed, and carries and places the semiconductor chip 1 on the printed circuit board 2. Accordingly, it is impossible to recognize a face on which the light-receiving element is formed by image recognition, because the surface of the semiconductor chip is covered with a suctioning apparatus. Therefore, an external form of the semiconductor chip 1 is recognized by image recognition and the external form is a used as a reference to decide a position of the semiconductor chip on the printed circuit board.

However, a positional relationship between the light-receiving surface 1a of the semiconductor chip 1 and the external form is not always the same. That is, the external form of the semiconductor chip 1 is defined when a wafer is divided by dicing so as to individualize the semiconductor chip 1. The position of the light-receiving surface relative to the external form of the semiconductor chip 1 is changed by changing the cutting position by dicing. Therefore, there may be a case in which a focal position of the lens 3 is not precisely coincident with a center of the light-receiving surface 1a.

Fourthly, a pad for wire-bonding, formed as a part of a wire pattern 2a, must be arranged around the semiconductor chip because the semiconductor chip is mounted on the printed circuit board by wire-bonding. Therefore, it is necessary to provide a place on the printed circuit board 2 where the bonding pad is arranged. The above-mentioned arrangement is an obstacle to miniaturize the semiconductor device package.

Lastly, the substantially necessary thickness as the semiconductor device package is equal to the sum of the focal distance of the lens 3 and the thickness of the semiconductor chip 1. However, according to the above-mentioned conventional semiconductor apparatus package, the actual thickness of the semiconductor device package is equal to the sum of the focal distance of the lens 3, the thickness of the semiconductor chip 1, and the thickness of the printed circuit board 2, because the printed circuit board 2 is arranged at the opposite side of the lens 3 regarding the semiconductor chip 1.

Therefore, the thickness of the semiconductor device package is increased by the thickness of the printed circuit board 2. Besides, when the electronic parts 9 are mounted, the actual thickness of the semiconductor device package is further increased with the thickness of the printed circuit board 8, because the printed circuit board 8 is further equipped under the printed circuit board 2.

SUMMARY OF THE INVENTION

Accordingly, it is a general object of the present invention is to provide a novel and useful semiconductor device in which the problems described above are eliminated.

Another and more specific object of the present invention is to provide a semiconductor device package whose thickness and area are smaller than a conventional device and to provide a method for making the same.

The above objects of the present invention are achieved by a semiconductor device including a resin housing provided with a functional part, a wire pattern made of a conductive material and molded in the resin housing, a part of the wire pattern being exposed from the resin housing, an electronic part connected with the wire pattern in a state where the electronic part is molded in the resin housing, and a semiconductor element connected to the part of the wire pattern exposed from the resin housing, wherein the semiconductor element provides a designated function in cooperation with a functional part of the resin housing.

According to the above invention, the wire pattern is molded in the resin housing, so that the board for supporting the wire pattern is not necessary. The thickness of the semiconductor device can be decreased by an equal length to the thickness of the board. Besides, the electronic part is also molded in the resin housing, and thereby the board for arranging the electronic part around the resin housing is not necessary. Hence, the area of the semiconductor device is reduced and the thickness of the semiconductor device is also decreased.

In the above-mentioned semiconductor device, the semiconductor element is flip chip mounted to the part of the wire pattern exposed from the resin housing.

According to the above invention, the semiconductor chip is mounted to the wire pattern of the resin housing through the projection electrode. Therefore, it is not necessary to arrange a wire for electrically connecting with the semiconductor element around the semiconductor element and to reduce the area of semiconductor device. Besides, the back which is an opposite side of the circuit forming face of the semiconductor chip can be held. Therefore, it is possible to mount the semiconductor chip while recognizing the image of the circuit forming face. Thus, it is possible to mount the semiconductor chip onto the board with high positioning accuracy.

Additionally, the part of the wire pattern exposed from the resin housing may project from a surface of the resin housing.

Accordingly, the semiconductor device can be mounted to other board easily by using the projected part of the wire pattern from the resin housing as an outside connecting terminal.

The resin housing may include a projection part projecting to the semiconductor chip side around the semiconductor element and the part of the wire pattern exposed from the resin housing exposes on a surface of the projection part.

Accordingly, the wire pattern provided at an end of the projection part can be used as an outside connecting terminal.

A distance between a surface of the wire pattern connected with the semiconductor chips and an end of the projection may be longer than a distance between the surface of the wire pattern connected with the semiconductor chips and a back surface of the semiconductor device.

Accordingly, it may be possible to mount the semiconductor device to the board by using the wire pattern provided at the end of the projection as a outside connection terminal. Therefore, a part for connecting the semiconductor device with the board is not necessary.

Besides, the resin housing may include comprises a projection part projecting directly under the electronic part and a part of the wire pattern extends at the projection part in a molded state. Hence, it is possible to arrange the wire pattern below the electric part and to have long distance between the wire pattern below the electric part and the electric part. Accordingly, it is possible to prevent the solder for connecting the electric parts from touching the wire pattern below the electric pattern, even if the solder is flowed below the electric parts.

The wire pattern may be formed by metal plating or a conductive resin. Hence, it is possible to form the wire pattern easily.

The functional part may include a lens for photographing, the semiconductor element is a solid-state image sensing chip having a light-receiving surface, and the lens for photographing and the solid-state image sensing chip are arranged on the resin housing in a state where a light passing through the lens for photographing is incident on the light-receiving surface of the solid-state image sensing chip. Hence, the semiconductor device may have so small area and thickness that it can be built in a mobile electric device and the like.

The functional part further may include a filter having an aperture on a surface thereof, and wherein the filter may be provided at the resin housing in a state where the filter is arranged between the lens for photographing and the semiconductor element. Hence, it is possible to arrange the filter between the lens for photographing and the light receiving surface of the semiconductor element, so that the semiconductor device for photographing having high functions can be provided.

It is also object to provide a semiconductor device for photographing including a resin housing having an opening extending between an upper surface of the resin housing and a bottom surface of the housing, a wire pattern made of a conductive material and molded in the resin housing, a part of the wire pattern being exposed on the bottom surface of the resin housing, an electronic part connected with the wire pattern in a state where the electronic parts is molded in the resin housing, a solid-state image sensing chip which is flip chip connected to the part of the wire pattern being exposed on the bottom surface of the resin housing, and a lens for photographing which is mounted on an upper face of the housing, wherein the lens for photographing and the solid-state image sensing chip are arranged in a state where a light passing through the lens for photographing is incident on a light-receiving surface of the solid-state image sensing chip through the opening of the resin housing.

Accordingly, the board for connecting the solid-state image sensing chip is not necessary because the solid-state image sensing chip is mounted to the resin housing directly. Therefore, the thickness of the semiconductor device for photographing is substantially equal to a sum of the focal length of the lens for photographing and the thickness of the solid-state image sensing chip. That is, it is possible to reduce the thickness of the entire semiconductor device because the thickness of the board for connecting the solid-state image sensing chip is not included in the whole semiconductor device. Furthermore, it is possible to make the formed circuit face including the light receiving face of the solid-state image sensing chip face opposite with the lens for photographing through the opening, because the lens for photographing and the solid-state image sensing chip are arranged at the both sides of the opening going through the resin housing. Besides, the back which is an opposite side of the formed circuit face of the semiconductor chip can be held when the solid-state image sensing chip is mounted to the resin housing, so that it is possible to arrange and mount to the semiconductor chip as recognizing the image. Thus, it is possible to arrange and mount to the semiconductor chip with high accuracy regarding a position of the semiconductor chip.

The semiconductor device for photographing may further include a filter having an aperture on a surface thereof, and wherein the filter is provided in the opening of the resin housing in a state where the filter is arranged between the lens for photographing and the semiconductor element.

Accordingly, it is possible to arrange the filter between the lens for photographing and the light receiving surface of the semiconductor element by only putting the filter in the opening of the resin housing. Therefore, the semiconductor device having high functions can be provided.

It is also object to provide a method for manufacturing a semiconductor device including the steps of forming a wire pattern made of a conductive material on a metal board, connecting an electronic part with the wire pattern, forming a resin housing in which the electronic part and the wire pattern are molded by encapsulating the electronic part and the wire pattern on the metal board, exposing a part of the wire pattern by removing the metal board from the resin housing and attaching a functional part to the resin housing, the functional part providing a designated function in cooperation with the semiconductor element.

Accordingly, it is possible to mold the wire pattern and the electronic part in the resin housing easily, and to expose the wire pattern on the base surface of the resin housing. Hence, it is possible to manufacture the above-mentioned semiconductor device easily.

In the method, a dimple part may be formed on the metal board prior to the step of forming the wire pattern so that the part of the wire pattern may be arranged in the dimple part.

Thus, it is possible to form the outside connecting terminal projecting from the surface of the resin housing easily. Besides, it is possible to form the projection part below the electric parts and the wire pattern can be arranged at the projection part.

In the method, the dimple part may be formed on the metal board by bending prior to the step of forming the wire pattern so that the part of the wire pattern may be arranged in the dimple part.

Hence, it is possible to form the projection part whose form corresponds to the dimple on the resin housing easily. It is possible to use the wire pattern at the end of the projection as the outside connecting terminal.

In the method, the wire pattern may be formed by metal plating. Hence, it is possible to form the wire pattern easily.

In the method, the metal board may be plated with a different metal from a metal which forms the metal board prior to the step of forming the wire pattern by the metal plating.

Hence, the etching speed is changed at the time of that the metal board is removed completely by etching, because the different metal from the metal board exists at the time of that the metal board is removed by etching. It is possible to control easily the completeness of the etching if a material whose etching speed is low or non-etching material is selected as the different material from the material board.

In the method, the wire pattern may be formed by a conductive resin. Accordingly, it is possible to form the wire pattern easily.

In the method, a functional part providing a designated function in cooperation with the semiconductor element may be attached on the resin housing, following the step of removing the metal board from the resin housing. Hence, it is possible to manufacture the semiconductor device providing the designated function by consecutive processes easily.

In the method, the functional part may include a lens for photographing, the semiconductor element is a solid-state image sensing chip having a light-receiving surface, and the lens for photographing and the solid-state image sensing chip are arranged on the resin housing in a state where a light passing through the lens for photographing is incident on the light-receiving surface of the solid-state image sensing chip.

Hence, it is possible to manufacture easily the semiconductor device unified by combination the lens for photographing and the solid-state image sensing chip by the resin housing. The area and thickness of the semiconductor device for photographing has so small area and thickness that it can be putted in the portable electronic device and the like.

It is also an object of the present invention to provide a semiconductor device for photographing including a lens holder having a lens for photographing, a resin molded body providing the lens holder, a solid-state image sensing chip mounted to a bottom surface of the resin molded body opposite to a surface on which the lens holder is mounted, and a board to which the resin molded body is mounted, wherein the board has an opening positioned at a place where the resin molded body is mounted, and the solid-state image sensing chip is mounted to the bottom surface of the resin molded body in a state where the solid-state image sensing chip is arranged in the opening.

According to the above-mentioned invention, the solid-state image sensing chip is provided in the opening of the board. Therefore, a thickness of the board does not include in a total height of the semiconductor device for photographing. Hence, it is possible to reduce the total height of the semiconductor device for photographing, thereby it is possible to manufacture a thin-typed semiconductor device for photographing It is also an object of the present invention to provide a method for manufacturing a semiconductor device, including the steps of mounting a resin molded body, which has an electrode projecting from a bottom surface thereof, to a board via the electrode, and mounting a solid-state image sensing chip to the bottom surface of the resin molded body through an opening provided in the board, after connecting the resin molded body to the board via the electrode.

According to the above-mentioned invention, after the resin molded body is connected, the solid-state image sensing chip is connected. Therefore, an exposed time to an outside atmosphere of the solid-state image sensing chip is short, thereby a possibility in that a dust or the like adheres on the solid-state image sensing chip is low. Hence, a decline in a picture quality caused by sticking the dust or the like to a light-receiving surface of the solid-state image sensing chip can be prevented.

It is also an object of the present invention to provide a semiconductor device for photographing including a resin housing provided with a functional part, a wire pattern made of a conductive material and molded in the resin housing, a part of the wire pattern being exposed from the resin housing, an image sensing chip connected to the part of the wire pattern exposed from the resin housing, and a semiconductor element for controlling provided to the resin housing and connected to the wire pattern, wherein the image sensing chip provides a photographing function in cooperation with the semiconductor element for controlling provided to the resin housing.

According to the above described invention, it is possible to divide into the image sensing chip having a sensor function and the semiconductor element for controlling the sensor function and provide them to one resin molded body. The image sensing chip and the semiconductor element for controlling are manufactured separately by proper methods for them respectively, so that both the image sensing chip and the semiconductor element for controlling can be manufactured efficiently. In addition, functions of both the image sensing chip and the semiconductor element for controlling are improved.

It is also an object of the present invention to provide a semiconductor device for photographing, including a lens holder having a lens for photographing, a resin molded body providing the lens holder, a solid-state image sensing chip mounted to a bottom surface of the resin molded body opposite to a surface on which the lens holder is mounted, and a board to which the resin molded body is mounted, wherein the board has an opening positioned at a place where the resin molded body is mounted, the solid-state image sensing chip is mounted to the bottom surface of the resin molded body in a state where the solid-state image sensing chip is arranged in the opening, and an underfill material fills up between the resin molded body and the board.

According to the above described invention, the resin molded body is fixed to the board strongly by the underfill material, so that it is possible to reinforce a connection of the resin molded body and the board. Therefore, reliablity of the semiconductor device for photographing can be improved.

It is also an object of the present invention to provide a semiconductor device for photographing, including a lens holder having a lens for photographing, a resin molded body providing the lens holder, a solid-state image sensing chip mounted to a bottom surface of the resin molded body opposite to a surface on which the lens holder is mounted, and a board to which the resin molded body is mounted, wherein the board has an opening positioned at a place where the resin molded body is mounted, the solid-state image sensing chip is mounted to the bottom surface of the resin molded body in a state where the solid-state image sensing chip is arranged in the opening, and the resin molded body is mounted to the board by an anisotropic conductive resin.

According to the above described invention, it is possible to fix the resin molded body to the board strongly by the anisotropic conductive resin. As a result, it is possible to reinforce a connection of the resin molded body and the board. Hence, reliablity of the semiconductor device for photographing can be improved.

It is also an object of the present invention to provide a semiconductor device for photographing, including a resin housing having an opening extending between an upper surface of the resin housing and a plane bottom surface of the housing, a wire pattern made of a conductive material and molded in the resin housing, a part of the wire pattern being exposed on the plane bottom surface of the resin housing, an electronic part connected with the wire pattern and molded in the resin housing, a solid-state image sensing chip which is flip chip mounted to the part of the wire pattern being exposed on the bottom surface of the resin housing, a lens for photographing which is mounted on an upper face of the housing, and a board to which the resin molded body is mounted, wherein the lens for photographing and the solid-state image sensing chip are arranged in a state where a light passing through the lens for photographing is incident on a light-receiving surface of the solid-state image sensing chip through the opening of the resin housing, and the wire pattern exposed on the bottom surface of the resin housing is electrically connected to the wire pattern of the board through a mount terminal made of metal.

According to the above described invention, the resin molded body is mounted to the board through the mount terminal provided separately without forming the resin bump on the bottom surface of the resin molded body. Therefore, it is possible to omit a manufacturing process by which the resin bump is formed. As a result, a manufacturing process of the semiconductor device for photographing can be simplified.

It is also an object of the present invention to provide a method for manufacturing a semiconductor device for photographing, including the steps of: forming a wire pattern made of a conductive material on a plane surface of a metal board, connecting an electronic part with the wire pattern, forming a resin housing in which the electronic part and the wire pattern are molded by encapsulating the electronic part and the wire pattern on the metal board, exposing a part of the wire pattern by removing the metal board from the resin housing, forming a mount terminal on the part of the wire pattern exposed on the plane bottom surface of the resin housing, mounting the resin housing on the board through the mount terminal, flip chip mounting an image sensing chip to the wire pattern exposed on the bottom surface of the resin housing, and attaching a functional part to the resin housing, the functional part providing a photographing function in cooperation with the image sensing chip.

According to the above described invention, after the resin molded body having a plane surface as a bottom surface of the resin molded body is formed, the mount terminal is formed on the bottom surface. The resin housing is mounted to the board through the mount terminal. Accordingly, it is possible to omit a manufacturing process by which the resin bump is formed. As a result, a manufacturing process of the semiconductor device for photographing can be simplified.

Other objects, features, and advantages of the present invention will be more apparent from the following detailed description when read in conjunction with the accompanying drawings.

DETAILED DESCRIPTION OF THE PREFERED EMBODIMENTS

A description will now be given, with reference to the drawings, of embodiments of the present invention.

Figure 3:
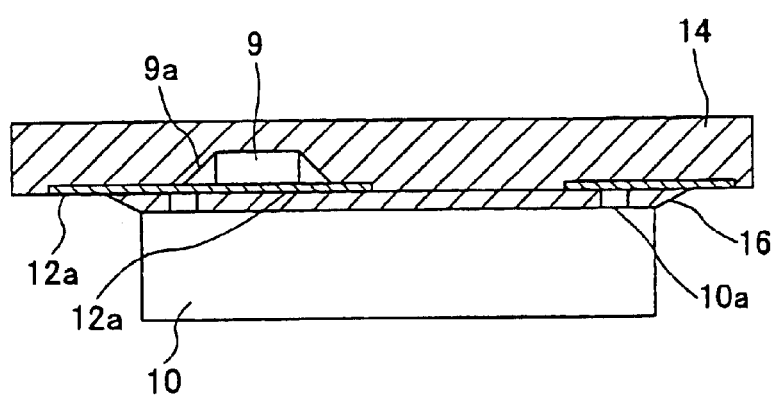
FIG. 3 is a cross-sectional view showing a semiconductor device package according to the present invention.

FIG. 3 is a cross-sectional view showing a semiconductor device package according to the present invention. The semiconductor device package shown in FIG. 3 includes a semiconductor chip 10, a wire pattern 12a and a housing 14. The semiconductor chip 10 and the housing 14 respectively correspond to the semiconductor chip 1 and the housing 4 shown in FIG. 1. The wire pattern 12a corresponds to the wire pattern 2a formed on the printed circuit board 2 shown in FIG. 1.

Figure 1:
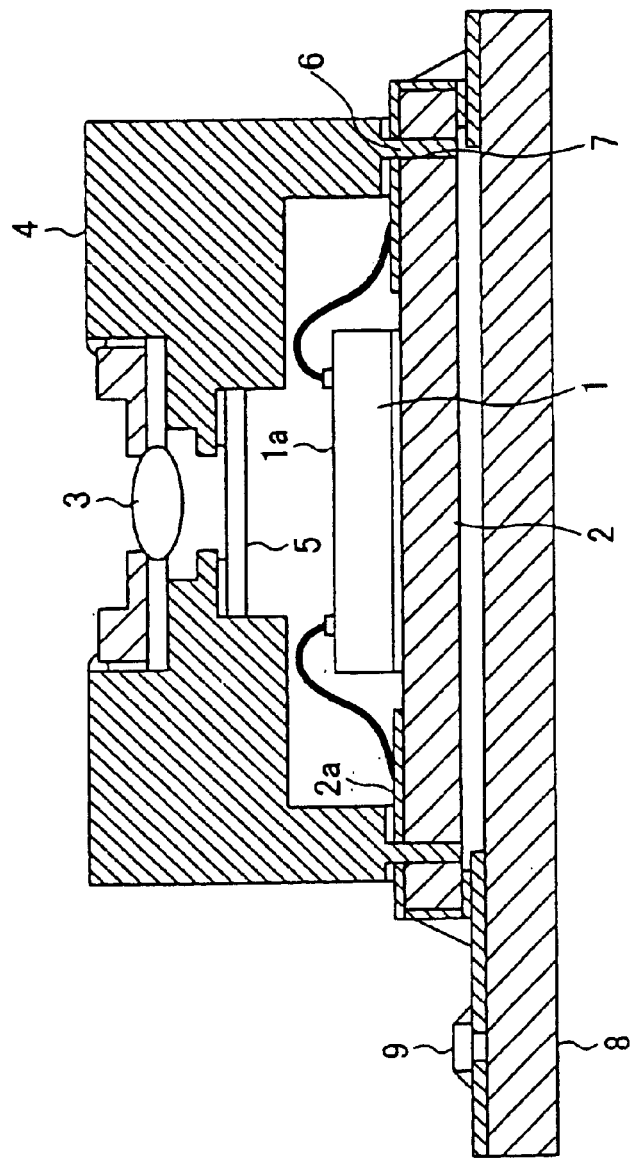
FIG. 1 is a cross-sectional view showing a conventional semiconductor device package unifying a lens and a semiconductor chip having a C-MOS sensor.

That is, the semiconductor device package according to the present invention does not have the printed circuit board 2 shown in FIG. 1, and the wire pattern 12a is exposed from a surface of the housing 14 in a state where the wire pattern 12a is molded in the housing 14. A projection electrode 10a of the semiconductor chip 10 is flip chip mounted to the wire pattern 12a by an anisotropic conductive resin 16. Although the wire pattern is formed on the board, the board is removed during the process for manufacturing the semiconductor device package and eventually is in a state shown in FIG. 3. The process for removing the board will be explained later.

On the back side of the wire pattern 12a, namely on the side of the housing 14, an electronic part 9 is connected by a solder 9a. That is, after the electronic part 9 is mounted on the wire pattern 12a, the electronic part 9 and the wire pattern 12a are molded by a resin forming the housing 14.

The housing 14 may be used for the purpose of not only mounting a lens for photographing as described later but also forming a semiconductor device package carrying out various functions with the semiconductor chip 10.

Figure 4:
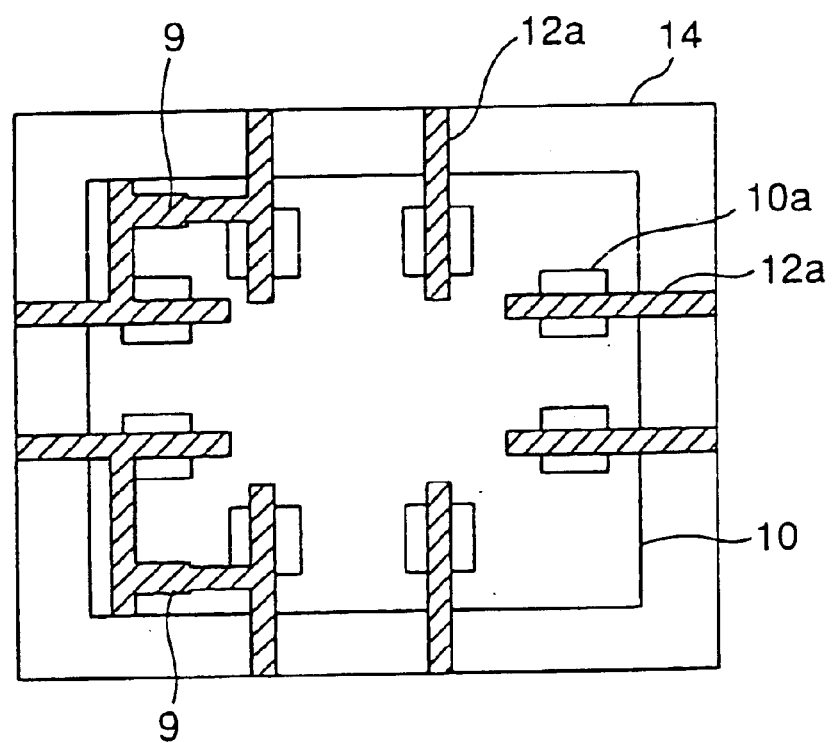
FIG. 4 is a plan view showing an arrangement of parts of the semiconductor device package shown in FIG. 3.

According to the above-mentioned embodiment, the electronic part 9 related to the semiconductor chip 10 is molded in the housing 14 and arranged inside the area of the semiconductor chip 10 as shown in FIG. 4. Thus, the electronic part 9 is not arranged outside the housing 14, so that the external form of the semiconductor device package does not become large. Furthermore, the printed circuit board 8 for providing the electronic part 9 as shown in FIG. 1 is not necessary, so that the thickness of the semiconductor device package can be decreased by the thickness corresponding to the printed circuit board 8. Besides, since the wire pattern 12a for mounting the semiconductor chip is held in a state where the wire pattern 12a is molded in the housing 14, the printed circuit board 2 shown in FIG. 1 is not needed. Accordingly, the thickness of the semiconductor device package can be further decreased by the thickness corresponding to the printed circuit board 2.

The method of manufacturing the semiconductor device package according to the present embodiment will be further explained as described later.

Figure 5:
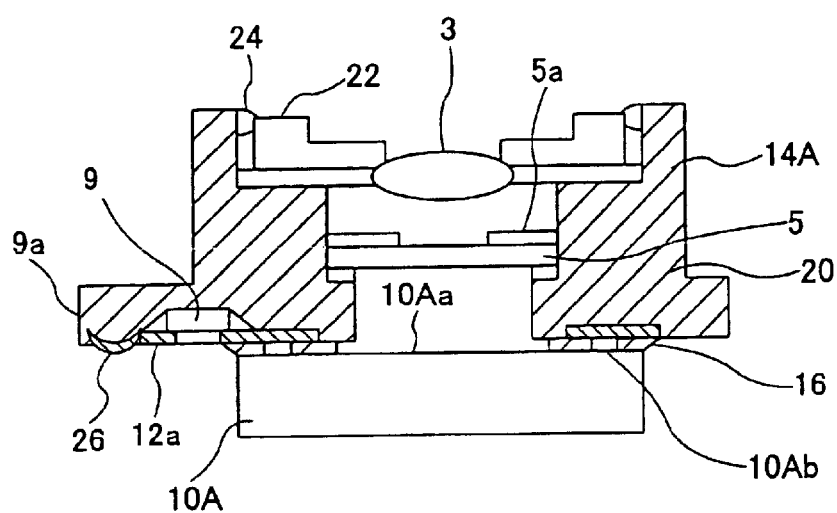
FIG. 5 is a cross-sectional view showing a semiconductor device package according to a first embodiment of the present invention.

Referring to FIG. 5, a semiconductor device for photographing according to a first embodiment of the present invention will be explained as follows. FIG. 5 is a cross-sectional view showing a semiconductor device for photographing according to the first embodiment of the present invention. In FIG. 5, parts that are the same as the parts shown in FIG. 1 are given the same reference numerals in, and explanation thereof will be omitted.

The semiconductor device for photographing according to the first embodiment of the present invention has a structure where a solid-state image sensing chip 10A is used as the semiconductor chip 10, and a housing 14A is used as the housing 14 to which the lens 3 is attached. Accordingly, the electronic part 9 connected to the solid-state image sensing chip 10A is molded in the housing 14A having the lens 3 for photographing. Thus, the semiconductor device for photographing according to the first embodiment of the present invention is put in a smaller horizontal projective area than the area of the semiconductor device for photographing shown in FIG. 1.

Figure 2:
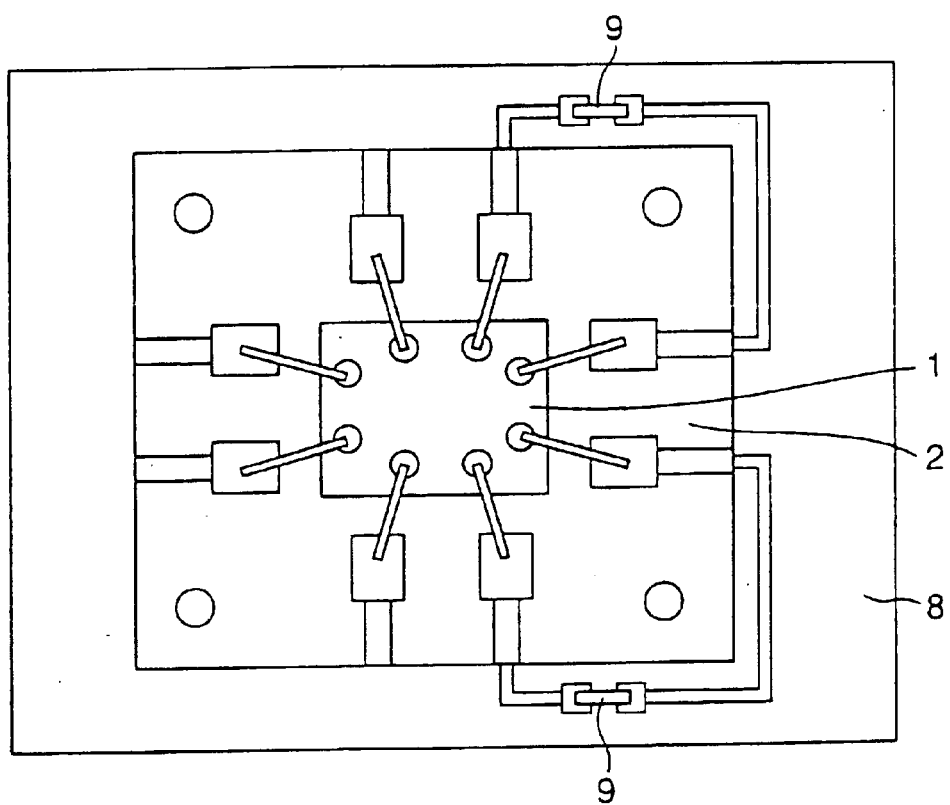
FIG. 2 is a plan view showing an arrangement of parts of the semiconductor device package shown in FIG. 1.

Furthermore, in the semiconductor device for photographing according to the first embodiment of the present invention, the printed circuit board for providing the electronic parts 9, namely the printed circuit board 8 shown in FIG. 1, is not necessary. Besides, the wire pattern 12a for mounting the solid-state image sensing chip 10A, namely the semiconductor chip 10, is held by being molded in the housing 14A. Therefore, the printed circuit board for providing the solid-state image sensing chip 10A, namely the printed circuit board 2 shown in FIG. 2, is also not necessary. Thus, a size measured in a height direction, namely the thickness, of the semiconductor device for photographing according to the first embodiment of the present invention is smaller than that of the semiconductor device for photographing shown in FIG. 1.

As described above, the area and thickness of the semiconductor device for photographing according to the first embodiment of the present invention are smaller than them of the semiconductor device for photographing shown in FIG. 1.

Next, a structure of the housing 14A will be explained.

The housing 14A has a through opening in almost center. A light from the lens 3 for photographing is incident through a through opening on a light-receiving surface 10Aa of the solid-state image sensing chip 10A. An IR filter 5 is arranged between the lens 3 for photographing and the light-receiving surface 10Aa of the solid-state image sensing chip 10A. The IR filter 5 is arranged on a step part of the through opening of the housing 14A and fixed by an adhesive 20. There is an aperture 5a having an opening of a designated size on the lens 3 side of the IR filter 5.

The lens 3 for photographing is provided on the opposite side of the solid-state image sensing chip 10A as to the through opening of the housing 14A and fixed by a lens holding lid 22. The lens holding lid 22 is fixed to the housing 14A by an adhesive 24. Accordingly, a light incident on the lens 3 for photographing is focused by the lens 3 for photographing and is incident on the light-receiving surface 10Aa of the solid-state image sensing chip 10A through the aperture 5a and the IR filter 5.

As described above, the wired pattern 12a is arranged on the base of the housing 14A in a state where the wire pattern 12a is molded in the housing 14A, and a projection electrode (bump) 14Ab of the solid-state image sensing chip 10A is flip chip mounted to the wire pattern 12a. An outside connecting terminal 26 is formed on the base of the housing 14A as an extending part of the wire pattern 12a.

Figure 6:
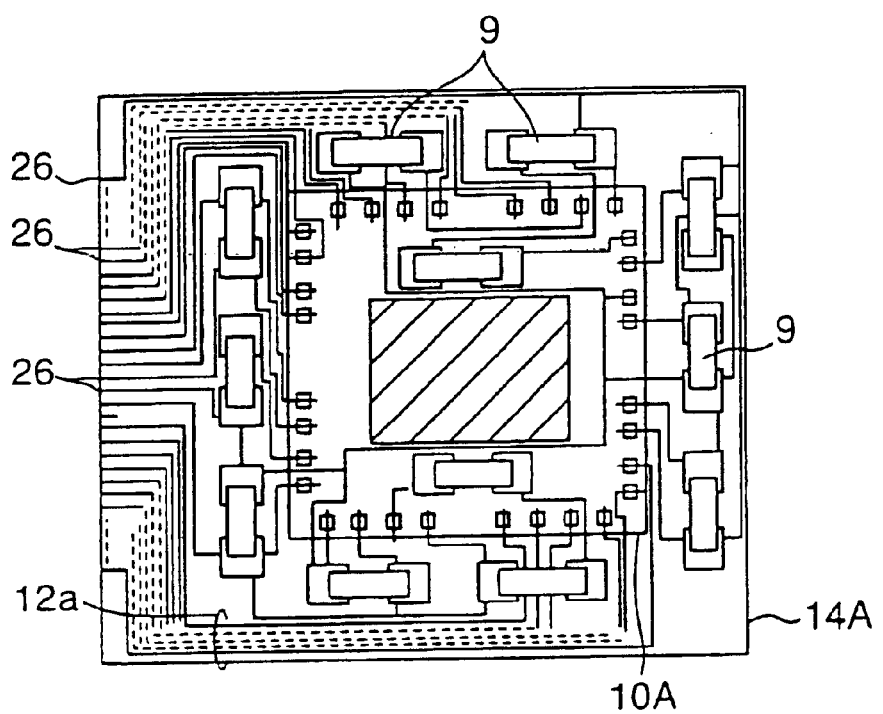
FIG. 6 is a plan view showing an arrangement of the parts of the semiconductor device for photographing according to the first embodiment of the present invention.

FIG. 6 is a plan view showing an arrangement of the parts of the semiconductor device for photographing as described above. An outermost line shown in FIG. 6 corresponds to the external form of the housing 14A. A hatched center area corresponds to the light-receiving surface 10Aa of the solid-state image sensing chip 10A.

Next, a method for manufacturing the semiconductor device for photographing shown in FIG. 5 will be explained with reference to FIGS. 7 to 18. FIGS. 7 to 18 are views showing the manufacturing process of the semiconductor device for photographing step by step. In the respective figures of FIGS. 7 to 18, (b) is a plan view, and (a) is a cross-sectional view along with a single dashed chain line of the plan view shown in (b).

Figure 7:
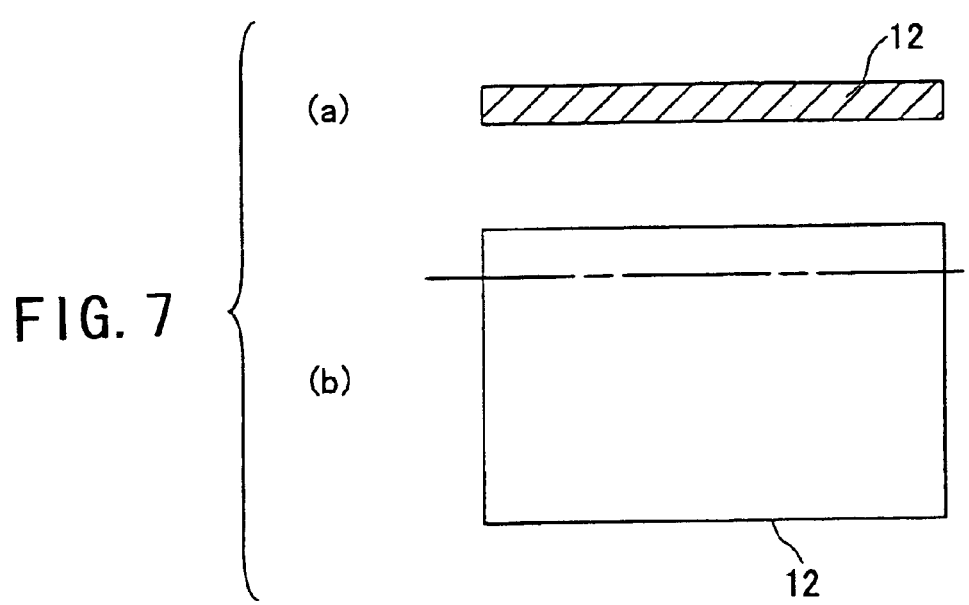
FIG. 7 is a view for explaining a manufacturing process of a semiconductor device for photographing according to the first embodiment of the present invention.

First of all, as shown in FIG. 7, the board 12 is prepared as a base for forming the wire pattern 12a. The board 12 is a copper plate having a thickness of 0.1 mm.

Figure 8:
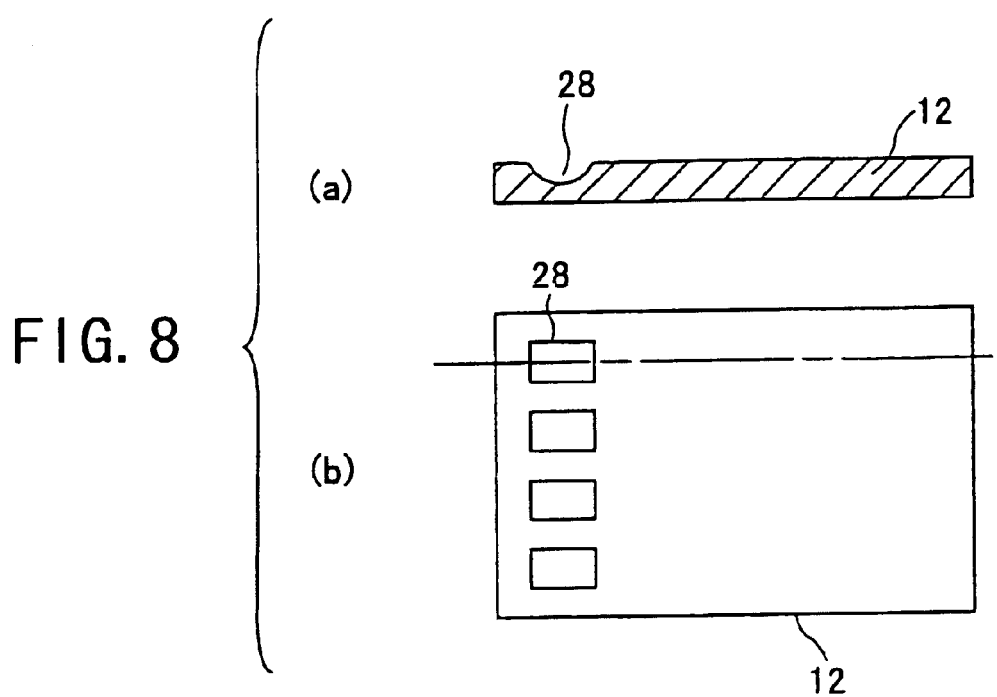
FIG. 8 is a view for explaining the manufacturing process of the semiconductor device for photographing according to the first embodiment of the present invention.

Next, as shown in FIG. 8, a dimple 28 is formed on a designated place of the board 12 by etching, press or the like. The dimple 28 is a hollow part for forming the outside connecting terminal 26 and is formed on the position of the outside connecting terminal 26 shown in FIG. 6.

Figure 9:
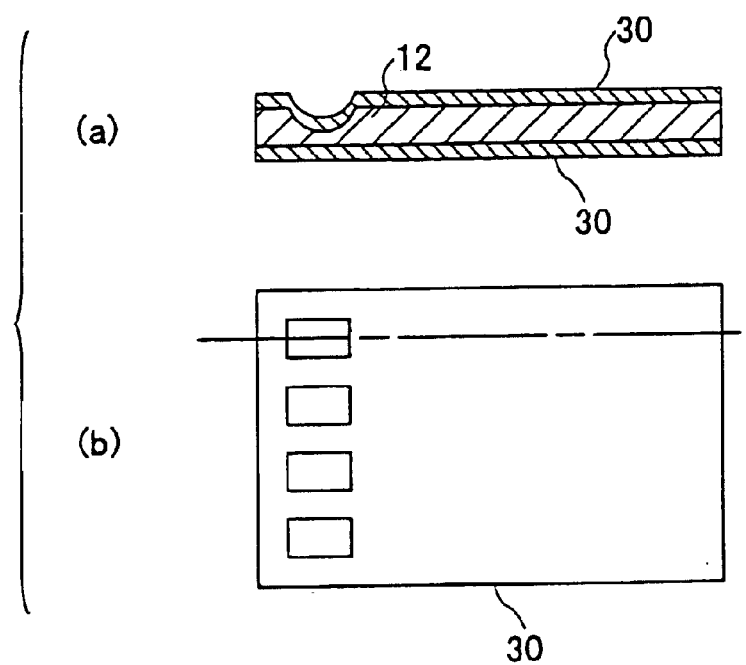
FIG. 9 is a view for explaining the manufacturing process of the semiconductor device for photographing according to the first embodiment of the present invention.
Figure 10:
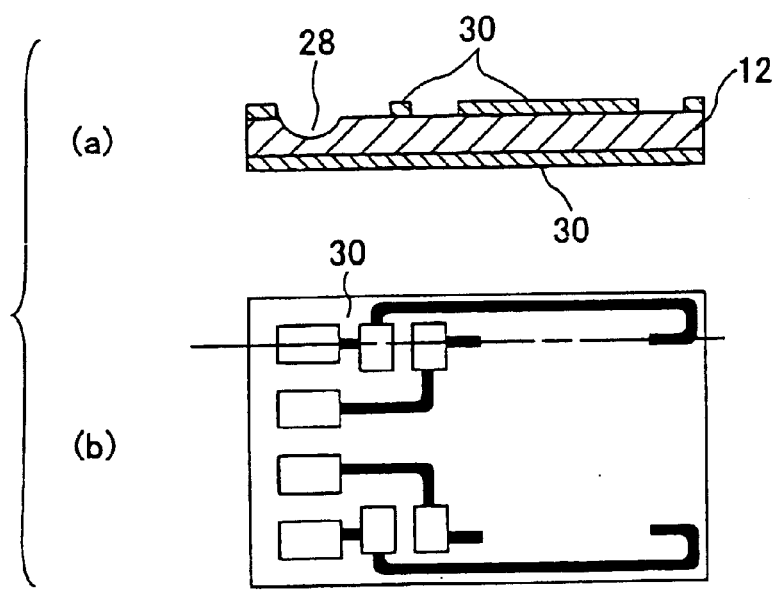
FIG. 10 is a view for explaining the manufacturing process of the semiconductor device for photographing according to the first embodiment of the present invention.

After that, as FIG. 9 shows, a photosensitive resist 30 is applied on the entire surface of the backside of the board 12. Then, as shown in FIG. 10, a resist 28 forming the wire pattern 12a is removed. The removal of the resist 28 is preformed by an exposure process or a developing process which is a known technology.

Figure 11:
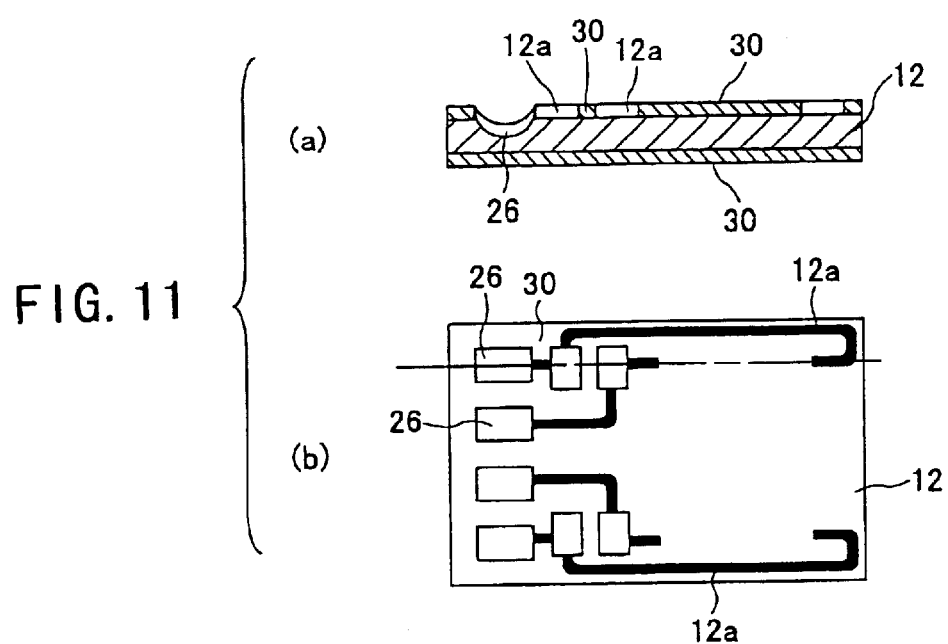
FIG. 11 is a view for explaining the manufacturing process of the semiconductor device for photographing according to the first embodiment of the present invention.

Following the above, as shown in FIG. 11, the wire pattern 12a is formed on the place where the resist 28 is removed. The wire pattern 12a is formed by depositing copper by an electrolytic plating or applying a conductive paste to the place where the resist 28 is removed. In case of using the electrolytic plating, it is preferred that a metal which is different from copper, a material of the board 12, such as gold, nickel or the like is plated first, and then the copper is plated. This is because the etching of the board 12 is stopped so as to remove only the board 12 at the layer of gold or nickel by etching due to difference in the etching speed between copper and gold or nickel.

Figure 12:
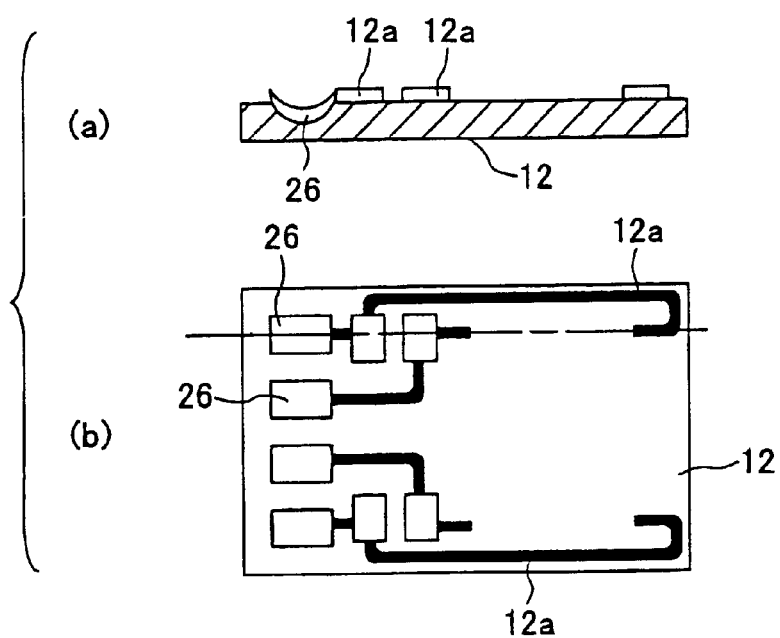
FIG. 12 is a view for explaining the manufacturing process of the semiconductor device for photographing according to the first embodiment of the present invention.
Figure 13:
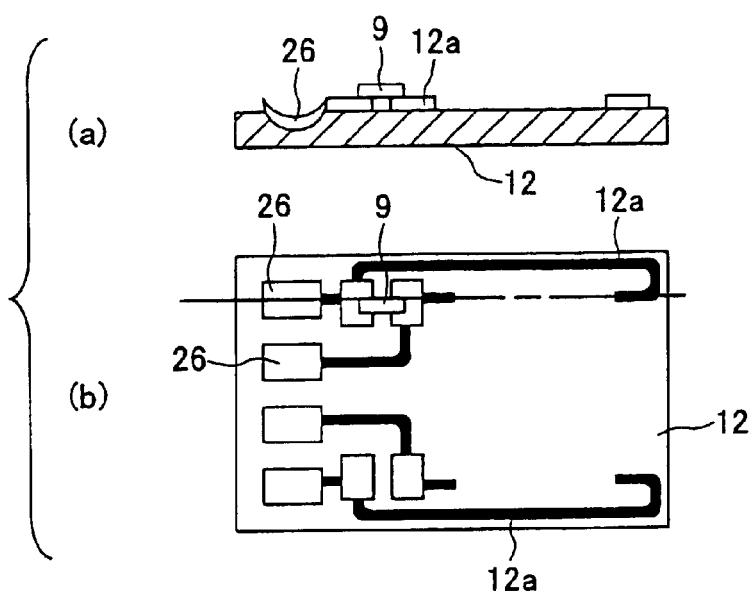
FIG. 13 is a view for explaining the manufacturing process of the semiconductor device for photographing according to the first embodiment of the present invention.

Next, as shown in FIG. 12, the remaining resist 30 is removed. The wire pattern 12a is formed on the board 12 as described above. The plated part in the dimple 28 corresponds to the outside connecting terminal 26. Following the above, as shown in FIG. 13, the electronic part 9 is mounted and soldered with the designated position of the wire pattern on the board 12.

Figure 14:
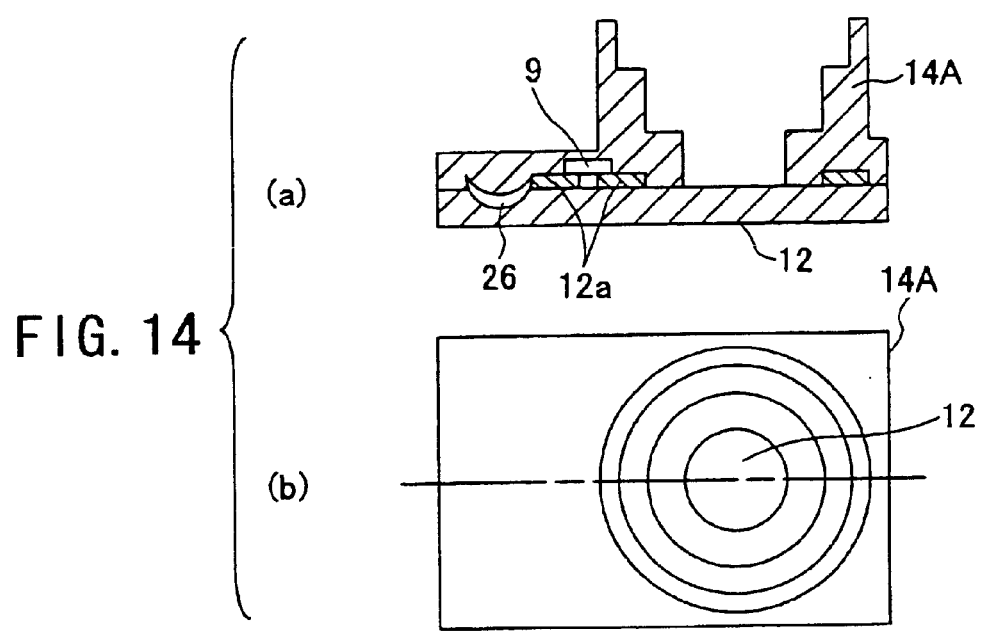
FIG. 14 is a view for explaining the manufacturing process of the semiconductor device for photographing according to the first embodiment of the present invention.

After that, as shown in FIG. 14, the housing 14A is molded by a resin. The housing 14A is formed on the side of that wire pattern 12a is formed. Therefore, the electronic part 9, the wire pattern 12a and the outside connecting terminal 26 are in a state where they are molded in the housing 14A.

Figure 15:
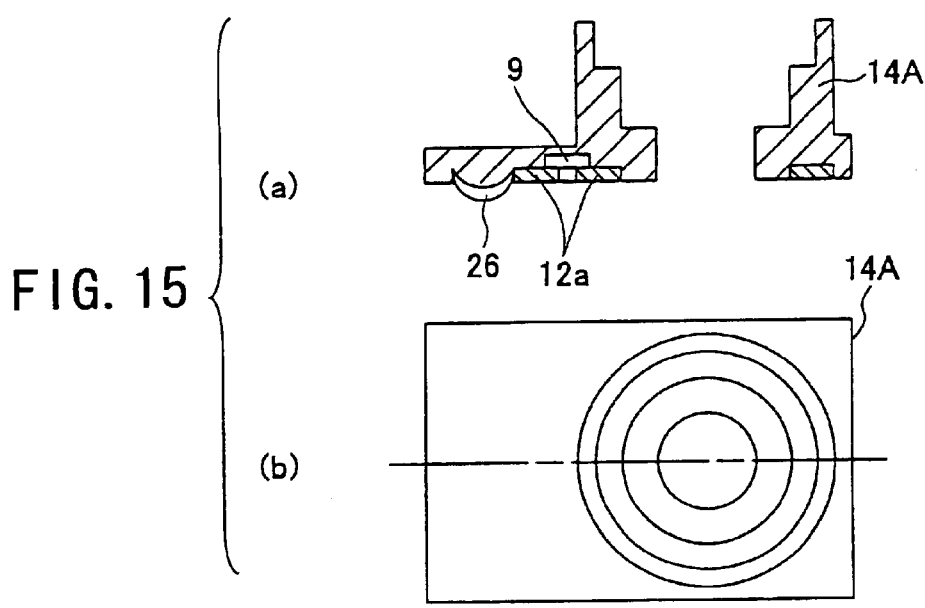
FIG. 15 is a view for explaining the manufacturing process of the semiconductor device for photographing according to the first embodiment of the present invention.

Next, as shown in FIG. 15, the board 12 is removed by etching. Although etching cupper is carried out at this time because the board is formed by copper, it is possible to remove only copper and prevent the wire patter 12a and the outside connecting terminal 26 from being removed if gold or nickel is plated during the plating process shown in FIG. 11. After the board 12 is removed, the housing 14A having the bottom surface on which the wire pattern 12a and the outside connecting terminal 26 are exposed remains. It may be possible to tear the board 12 off instead of removing the board 12 by etching.

The outside connecting terminal 26 projects from the bottom surface of the housing 14A after the board 12 is removed, because the outside connecting terminal 26 is formed in the dimple 28 of the board 12. Thus, in case of that the semiconductor device for photographing according to the present embodiment is connected with another board for instance, it is possible to connect with another board easily by using the projective outside connecting terminal 26. In the meantime, it is not always needed that the outside connecting terminal 26 is projectively arranged. The outside connecting terminal 26 may be only exposed on the bottom surface of the housing 14A as well as the wire pattern 12a. In such a case it is not necessary to form the dimple 28 on the board 12.

Figure 16:
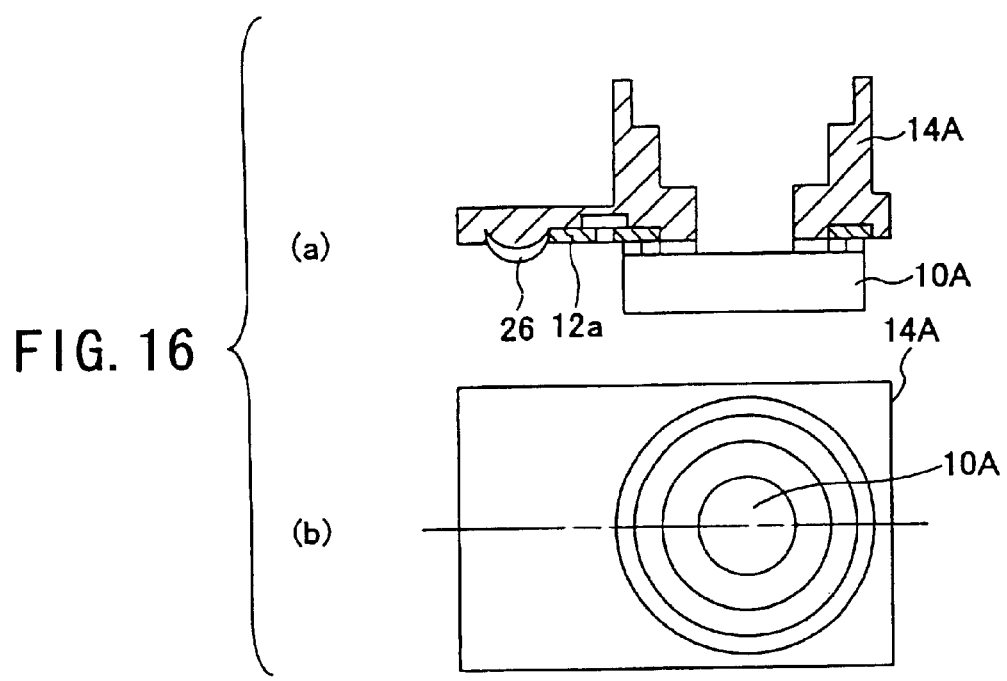
FIG. 16 is a view for explaining the manufacturing process of the semiconductor device for photographing according to the first embodiment of the present invention.

After removing the board 12, as shown in FIG. 16, the solid-state image sensing chip 10A is flip chip mounted to the wire pattern 12a exposed on the bottom surface of the housing 14A by the anisotropic conductive resin 16.

Figure 17:
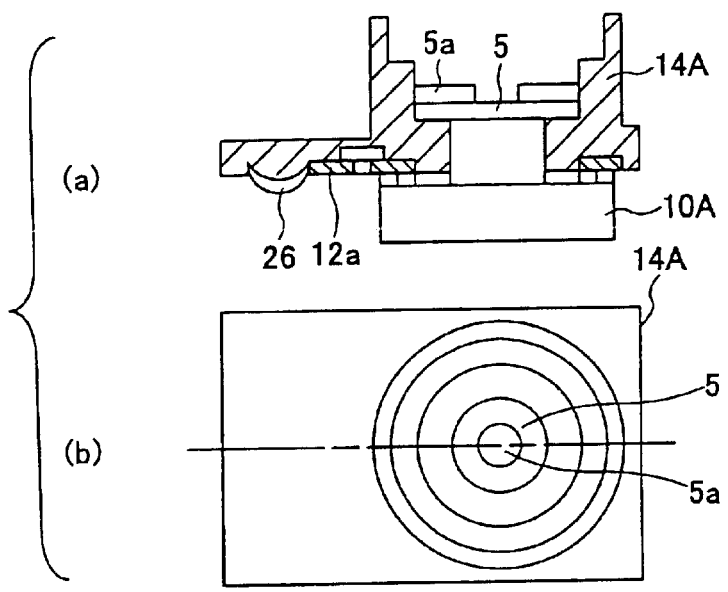
FIG. 17 is a view for explaining the manufacturing process of the semiconductor device for photographing according to the first embodiment of the present invention.
Figure 18:
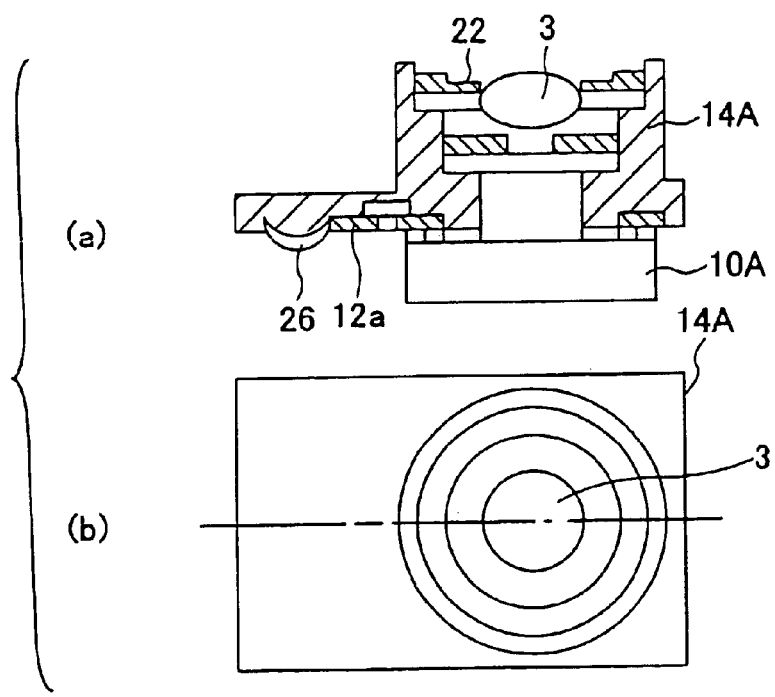
FIG. 18 is a view for explaining the manufacturing process of the semiconductor device for photographing according to the first embodiment of the present invention.

Thereafter, as shown in FIG. 17, the IR filter 5 having the aperture 5a on its upper face is fitted in the housing 14A and fixed by an adhesive. Then, as shown in FIG. 18, the lens 3 is fitted in the housing 14A and fixed by the lens holding lid 22 and the semiconductor device for photographing is completed.

Figure 19:
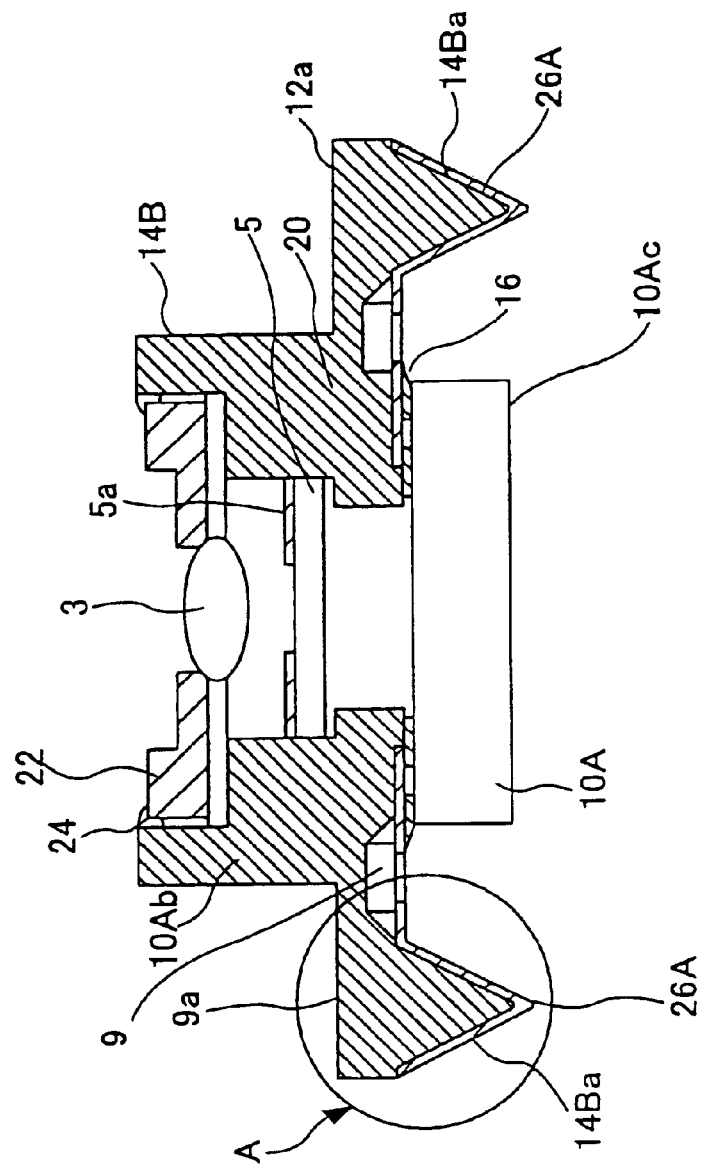
FIG. 19 is a cross-sectional view showing a semiconductor device for photographing according to the second embodiment of the present invention.
Figure 20:
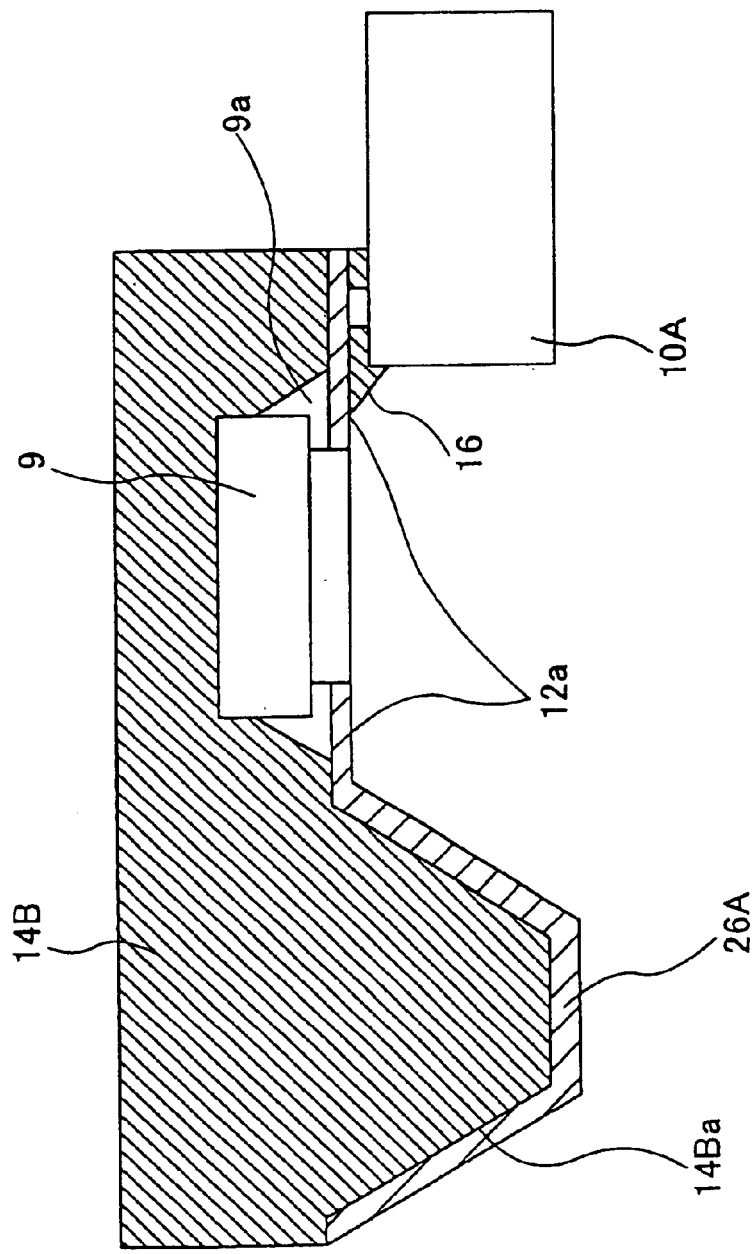
FIG. 20 is an enlarged view of a part A shown in FIG. 19.

Next, a semiconductor device for photographing according to the second embodiment of the present invention will be explained referring to FIGS. 19 and 20. FIG. 19 is a cross-sectional view showing a semiconductor device for photographing according to the second embodiment of the present invention. FIG. 20 is an enlarged view of a part A shown in FIG. 19. In FIGS. 19 and 20, parts that are the same as the parts shown in FIG. 5 are given the same reference numerals in, and explanation thereof will be omitted.

The semiconductor device for photographing according to the second embodiment of the present invention substantially has the same structure as the first embodiment of the present invention as described above. The difference between the second embodiment and the first embodiment is a structure of the housing 14A. That is, the semiconductor device for photographing according to the second embodiment of the present invention has a housing 14B instead of the housing 14A. Hence, the outside connecting terminal 26 of the first embodiment is replaced by an outside connecting terminal 26A.

As shown in FIGS. 19 and 20, a housing 14B has a projection part 14Ba, which is projected from a back face 10Ac of the solid-state image sensing chip 10A, is near the solid-state image sensing chip 10A. The outside connecting terminal 26A is formed on the projection part 14Ba. Accordingly, the outside connecting terminal 26A is projected from the back face 10Ac of the solid-state image sensing chip 10A.

In the above state, the semiconductor device for photographing is held by the outside connecting terminal 26A, in a case where the semiconductor device for photographing is put on a plane. Accordingly, the semiconductor device for photographing according to the present embodiment can be put on and mounted to the printed circuit board by using the outside connecting terminal 26A, for example. Hence, it is not necessary to prepare a flexible board and the like for connecting external devices, so that cost and size of the apparatus using the semiconductor device for photographing can be reduced.

Next, a method of manufacturing the semiconductor device for photographing according to the second embodiment of the present invention will be explained with reference to FIGS. 21 and 22.

Figure 21:
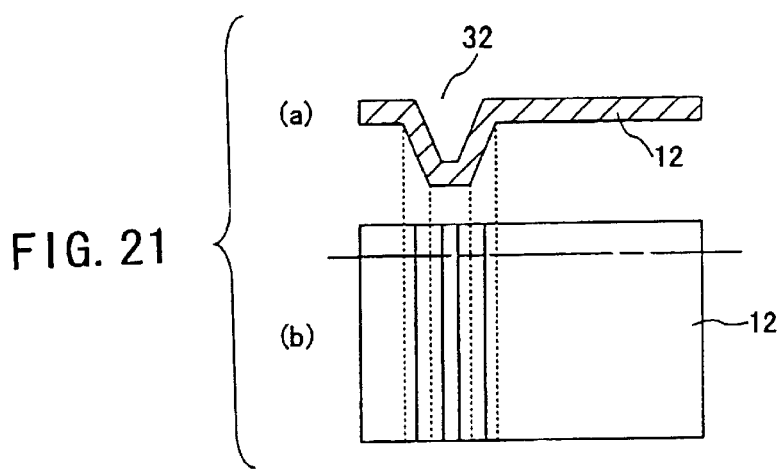
FIG. 21 is a view for explaining a manufacturing process of the semiconductor device for photographing according to the second embodiment of the present invention.
Figure 22:
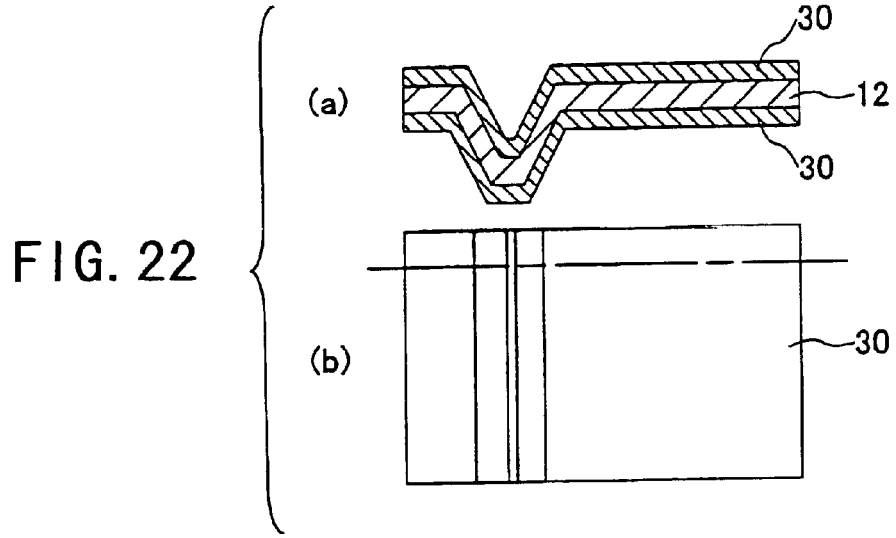
FIG. 22 is a view for explaining the manufacturing process of the semiconductor device for photographing according to the second embodiment of the present invention.

The method of manufacturing the semiconductor device for photographing according to the second embodiment of the present invention is substantially the same as the one according to the first embodiment of the present invention shown in FIGS. 7 to 18 and only the process shown in FIG. 21 is different.

That is, in the process of the method of manufacturing the semiconductor device for photographing according to the second embodiment of the present invention, a relatively big hollow part 32 is formed by bending the board 12 as shown in FIG. 21, prior to the wire pattern 12a is formed. The process shown in FIG. 21 is carried out instead of the process shown in FIG. 7.

The photosensitive resist 30 is applied on the both faces of the board 12 in order to form the wire pattern 12a. The process shown in FIG. 22 corresponds to the process in FIG. 9. The processes following the process shown in FIG. 22 are the same as the method of manufacturing the semiconductor device for photographing according to the first embodiment, and their explanations will be omitted.

Figure 23:
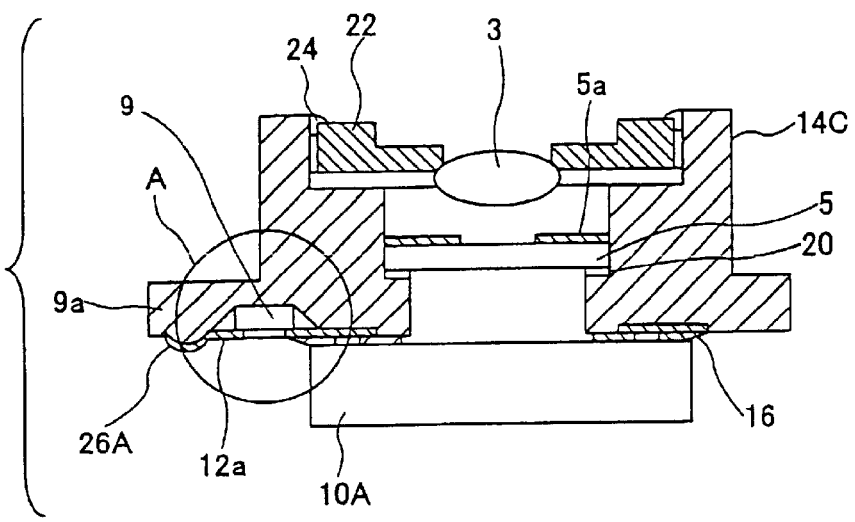
FIG. 23 is a cross-sectional view showing a semiconductor device according to the third embodiment of the present invention.
Figure 24:
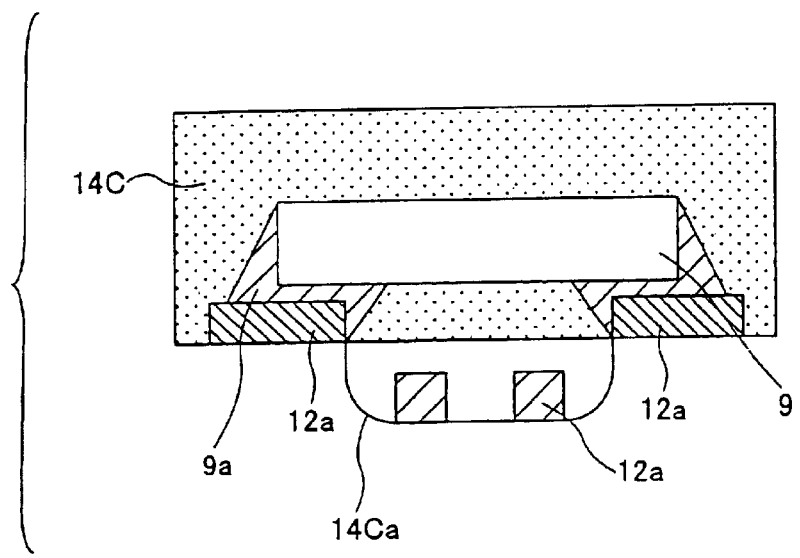
FIG. 24 is an enlarged view of a part A shown in FIG. 23.
Figure 25:
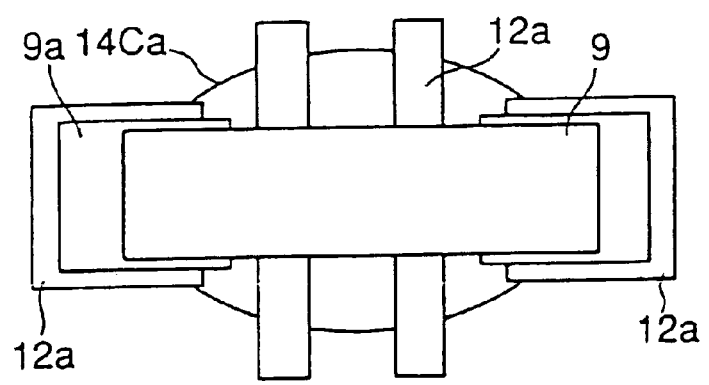
FIG. 25 is a plan view showing an arrangement of parts arranged on the part A shown in FIG. 23.

Next, the semiconductor device for photographing according to the third embodiment of the present invention will be explained by referring to FIGS. 23 and 24. FIG. 23 is a cross-sectional view showing a semiconductor device according to the third embodiment of the present invention. FIG. 24 is an enlarged view of a part A shown in FIG. 23. FIG. 25 is a view showing an arrangement of parts arranged on the part A shown in FIG. 23. In FIG. 23 to 25, parts that are the same as the parts shown in FIG. 5 are given the same reference numerals in, and explanation thereof will be omitted.

The semiconductor device for photographing according to the third embodiment of the present invention has substantially the same structure as the device according to the first embodiment of the present invention except for the structure of the housing 14A. That is, the semiconductor device for photographing according to the third embodiment of the present invention has a housing 14C instead of the housing 14A according to the first embodiment.

As shown in FIG. 23, the housing 14c includes a projection part 14Ca projecting below the electric part 9. As shown in FIG. 24 in detail, a part of the wire pattern 12a is extended to the projection part 14Ca. That is, the wire pattern 12a extended below the electric part 9 is molded in the projection part 14Ca. Hence, it is possible to arrange the wire pattern 12a below the electronic part 91 and to have enough distance between the wire pattern 12a and the solder 9a connecting to the electric parts 9.

Figure 26:
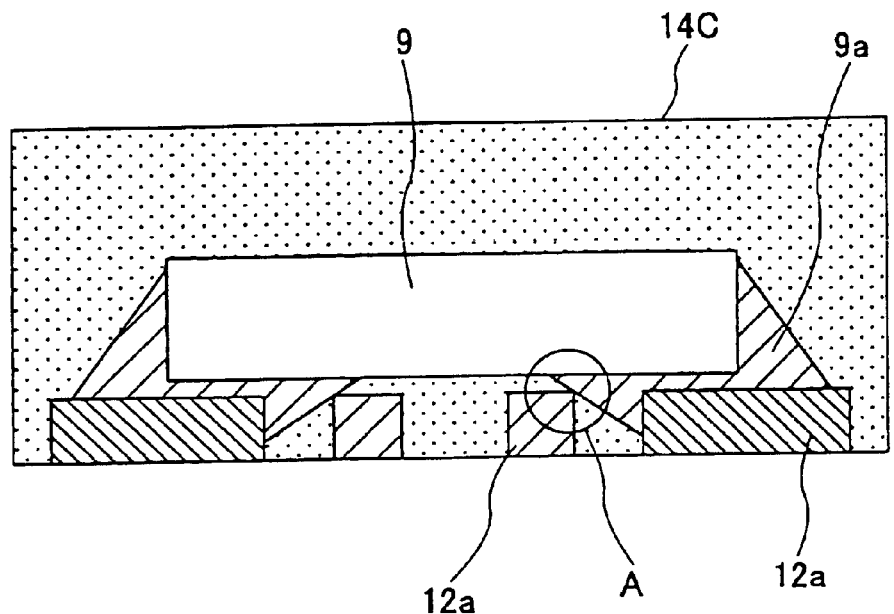
FIG. 26 is a view in a state where a wire pattern is arranged at an under side of electronic parts without forming a projection part.

FIG. 26 is a view in a state where a wire pattern 12a is arranged under the electronic part 9 without forming a projection part. In this state, as shown in a part A in the FIG. 26, the distance between the wire pattern 12a and electronic part 9 is very short. Besides, in case of that the solder 9a for connecting with electronic part 9 flows inside of the electronic part 9, there is a possibility that the solder 9a contacts the wire pattern 12a extending below the electronic part 9.

However, if the projection part 14Ca is formed on the housing 14C and the wire pattern 12a is molded in the projection part 14Ca, it is possible to have enough distance between the wire pattern 12a extending below the electric part 9 and the electric part 9 and between the wire pattern 12a extending below the electric part 9 and the solder 9a for connecting the electric part 9. Thus, it is possible to arrange the wire pattern 12a below the electric part 9, and a flexibility to design the wire pattern 12a can be improved.

In the meantime, the projection part 14Ca can be manufactured by a process as well as the process shown in FIG. 11. That is, the dimple is formed in a position where the electric part 9 is arranged on the board 12 and the wire pattern 12a is formed in the dimple, prior to the wire pattern 12a is formed on the board 12.

Figure 27:
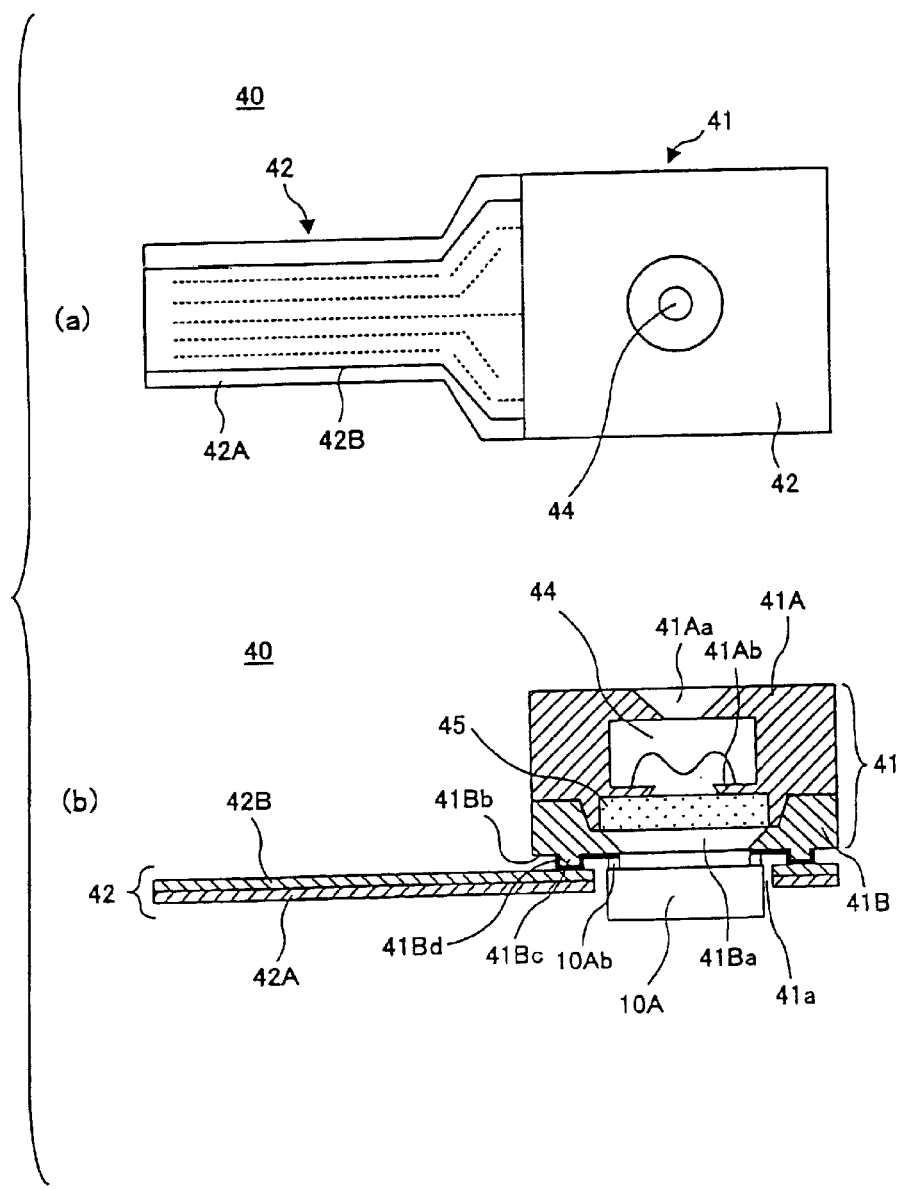
FIG. 27-(a) is a plan view showing a semiconductor device for photographing according to a fourth embodiment of the present invention and FIG. 27-(b) is a cross-sectional view showing a semiconductor device for photographing according to the fourth embodiment of the present invention.

Next, referring to FIG. 27, a semiconductor device 40 for photographing according to a fourth embodiment of the present invention will be explained. FIG. 27-(a) is a plan view showing the semiconductor device for photographing according to the fourth embodiment of the present invention and FIG. 27-(b) is a cross-sectional view showing a semiconductor device for photographing according to the fourth embodiment of the present invention.

The semiconductor device for photographing 40 in this embodiment includes a housing 41 and a board 42. A lens 44 for photographing and the solid-state image sensing chip 10A are provided on the housing 41. The housing 41 is mounted on the board 42.

In this embodiment, the housing 41 is separately formed from a lens holder 41A and a resin molded body 41B made of resin. The lens 44 for photographing is arranged on a substantially center part of the lens holder 41A. An opening part 41Aa is formed on an upper part of the lens 44 for photographing in order to take an image to the lens 44. An aperture 41Ab is formed under the lens 44 for photographing. An IR filter 45 is arranged under the aperture 41Ab.

The lens holder 41A having an above-described structure is provided on the resin molded body 41B having an opening part 41Ba arranged in a center part of the resin molded body 41B. Electronic parts are provided inside of the resin molded body 41B in this embodiment as well as in the third embodiment. An outside connecting terminal 41Bd is formed on a projection part 41Bc projecting from a bottom surface 41Bb. Providing the electronic parts inside of the resin molded body 41B and forming the outside connecting terminal 41Bd in this embodiment are implemented by an equivalent way to the third embodiment, and hence explanation thereof will be omitted.

The solid-state image sensing chip 10A is flip chip mounted to the bottom surface 41Bb of the resin molded body 41B. The light-receiving surface 10Aa of the solid-state image sensing chip 10A faces the lens 44 for photographing through the opening part 41Ba of the resin molded body 41B. Hence, it is possible to form a picture taken by the lens 44 for photographing on the light-receiving surface 10Aa.

In this embodiment, the housing 41 is mounted to the board 42 by the outside connecting terminal 41Bd formed on the bottom surface 41Bb of the resin molded body 41B of the housing 41.

The board 42 includes a polyimide film 42A and a wire 42B. The wire 42B is formed on the polyimide film 42A and made of a copper plate, a copper foil, or the like. An opening part 41a is formed on the board 42 due to existence of the solid-state image sensing chip 10A because the solid-state image sensing chip 10A is connected on the bottom surface 41Bb of the resin molded body 41B.

The solid-state image sensing chip 10A has, for instance, a thickness of 600 μm or less. On the other hand, the board 42 has a thickness of 100 μm or less. The outside connecting terminal 41Bd has a projecting height from the base surface 41Bb of the resin molded body 41B of approximately 80 μm. Therefore, a sum of the thickness of the board 42 and the projecting height of the outside connecting terminal 41Bd is much shorter than the thickness of the solid-state image sensing chip 10A. The total height of the semiconductor device 40 for photographing is a sum of the height of housing 41 and the thickness of the solid-state image sensing chip 10A. In this embodiment, the thickness of the board 42 and the projecting height of the outside connecting terminal 41Bd are not included in the total height of the semiconductor device for photographing 40 because the solid-state image sensing chip 10A is provided in the opening part 41a formed on the board 42. It is a significant advantage of the present invention that the thickness of the board 42 can be reduced from the total height of the semiconductor device 40 for photographing, because the semiconductor device 40 for photographing is generally provided into a small-sized apparatus such as a mobile apparatus.

Figure 28:
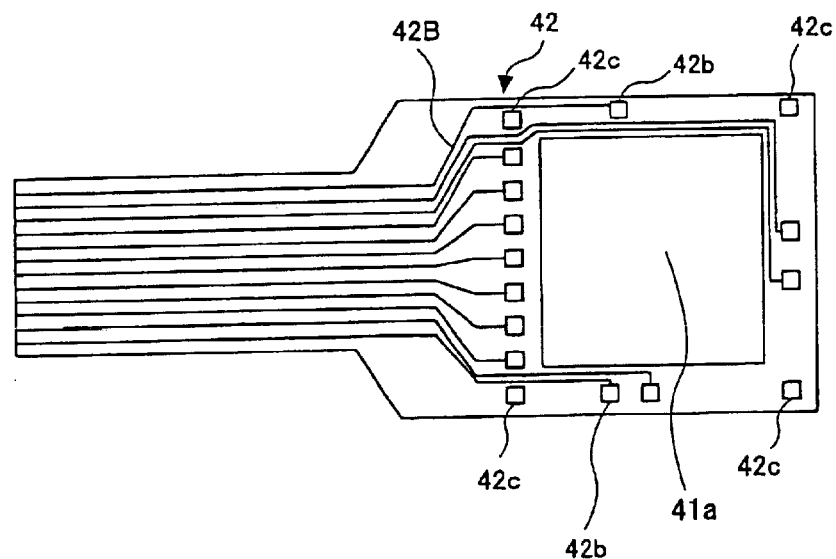
FIG. 28 is a plan view showing an example regarding a board shown in FIG. 27.

FIG. 28 is a plan view showing an example regarding a board shown in FIG. 27. Electrode lands 42b are provided around the opening part 41a of the board 42. The outside connecting terminal 41Bd of the resin molded body 41B of the housing 41 is connected with the electrode land 42b. The electrode land 42b is lead-connected with an end part of the board 42 by the wire 42B.

Dummy lands (electrode pads) 42c are arranged on vicinities of corners of the opening part 41a of the board 42. The dummy bump 42c is not connected with the wire 42B, thereby the dummy bump 42c electrically isolated. The dummy lands 42c are formed as corresponding to dummy bumps (dummy projection parts) formed on four corners of the resin molded body 41B. The dummy bump of the resin molded body 41B is formed as well as the projection part 41Bc and the outside connecting terminal 41Bd. However, the dummy bump is electrically isolated because the dummy bump is not connected with the electrode of the solid-state image sensing chip 10A which is mounted on the bottom surface 41Bb of the resin molded body 41B. The corners of the board 42 are fixed to the resin molded body 41B by connecting the dummy bumps of the resin molded body 41B with the dummy lands 42c of the board 42.

If the corners of the board 42 are not fixed, disadvantages, such that the corners wind or bend backward during a manufacturing process and in a use for long period of time, may occur. When the outside connecting terminals 41Bd are provided in the vicinity of the four corners of the opening part 41a of the board 42, the outside connecting terminals 41Bd are connected with the electrode lands 42b of the board 42 and corners of the board 42 are fixed. However, depending on the positions of the electrode of the solid-state image sensing chip 10A, it may be unnecessary that the outside connecting terminals 41Bd are provided in the vicinity of the four corners of the opening part 41a. In such case, it is possible to prevent a generation of winding or bending backward of the corners of the opening part 41a of the board 42 by fixing the vicinity of the four corners of the opening part 41a with the resin molded body 41B. If the outside connecting terminals 41Bd are formed on the four corners of the opening part 42a, the dummy bumps are not necessary to be formed, thereby not the dummy lands 42C but the electrode lands 42b are arranged.

Figure 29:
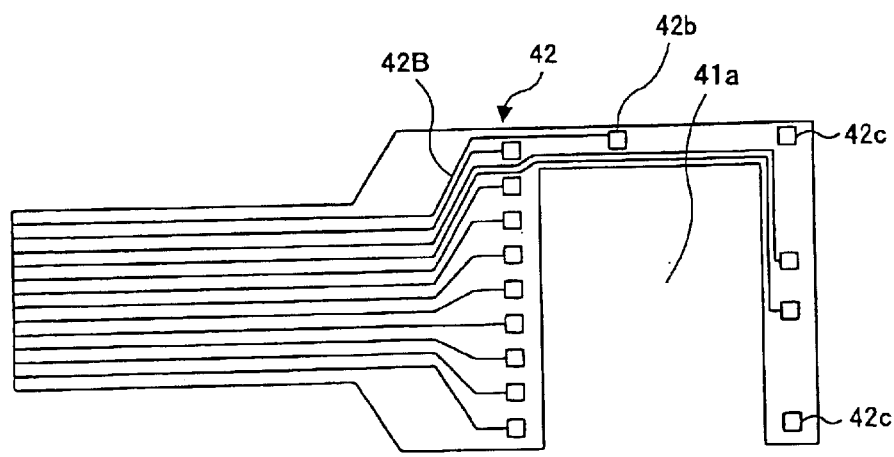
FIG. 29 is a plan view showing another example regarding a board shown in FIG. 27.

FIG. 29 is a plan view showing another example of the board 42. The opening part 41a of the board 42 shown in FIG. 29 has a opening and rectangular configuration but not having one side. Because of this configuration of the opening part 41a, it may be possible to easily take-the solid-state image sensing chip 10A into the opening part 42a. For this structure of the opening part 42a, it is effective to connect the four corners by the dummy bumps.

Figure 30:
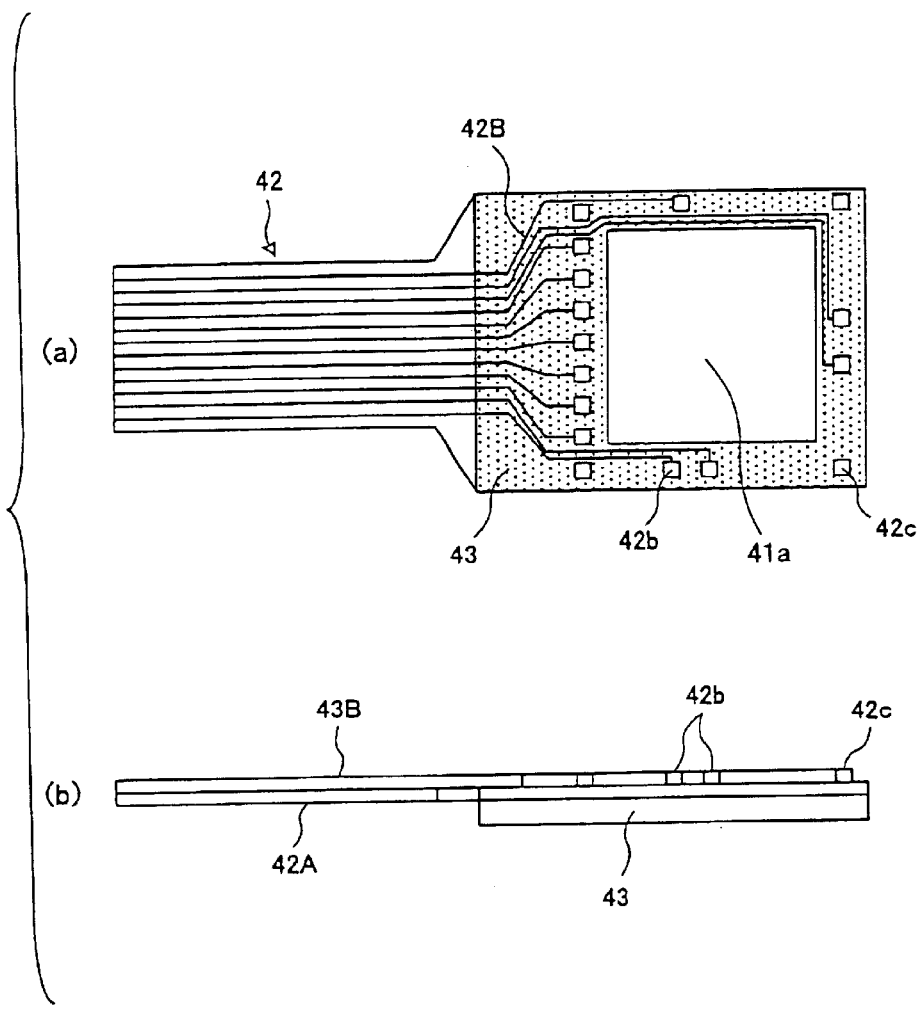
FIG. 30-(a) is a plan view showing a state in which a reinforcement board is attached to a back surface of a board shown in FIG. 28 and FIG. 30-(b) is a side view showing a state in which a reinforcement board is attached to a back surface of a board shown in FIG. 28.

FIG. 30-(a) is a plan view showing a state in which a reinforcement board is stuck on a back surface of the board 42 shown in FIG. 28 and showing the board 42 seen from a side of the wire 42B. FIG. 30-(b) is a side view showing a state in which a reinforcement board is stuck on a back surface of the board shown in FIG. 28. A periphery of the opening part 42a of the board 42 has a narrow width, thereby bending of the board is apt to occur. When bending of the board 42 occur, a gap of the positioning of the resin molded body 41B or an un-satisfactory connection may be generated, at the time when the resin molded body 41B is provided on the board 42. Accordingly, the reinforcement board 43 is attached to the periphery of the opening part 41a of the board 42 by an adhesive or the like, thereby the generation of the bending may be prevented.

The polyimide film may be desirable to be utilized for the reinforcement board 43 as well as the base of the board 42. The reinforcement board 43 has a thickness of 50 μm to 100 μm. If the reinforcement board 43 preferably has a thickness of 50 μm to 100 μm, a sum of the thickness of the board 42 and the thickness of the reinforcement board 43 is shorter than the thickness of the solid-state image sensing chip 10A, thereby the semiconductor device 40 for photographing can have sufficiently small thickness so as to be incorporated into the small-sized apparatus.

Figure 31:
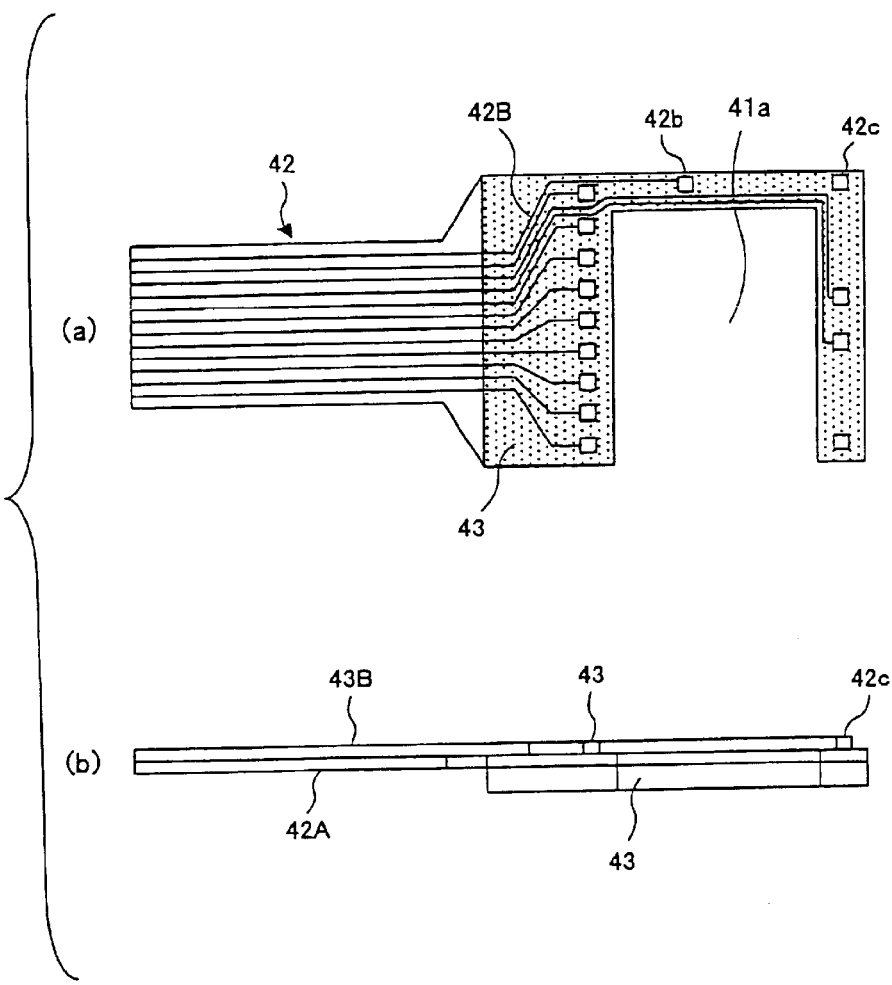
FIG. 31-(a) is a plan view showing a state in which a reinforcement board is attached to a back surface of a board shown in FIG. 29 and FIG. 31-(b) is a side view showing a state in which a reinforcement board is attached to a back surface of a board shown in FIG. 29.

FIG. 31-(a) is a plan view showing a state in which the reinforcement board 46 is attached to the back surface of the board 42 shown in FIG. 29 and showing the board 42 seen from a side of the wire 42B. FIG. 31-(b) is a side view showing a state in which the reinforcement board 46 is attached to the back surface of the board 42 shown in FIG. 29. The advantages of the reinforcement board 46 in FIG. 31 is equivalent to the advantages of the reinforcement board 46 in FIG. 30, therefore the same explanation thereof will be omitted. In this particular case, the opening part 41a has an opening and rectangular configuration but not having one side. Hence, bending of the board 42 is apt to occur. Therefore, it is important to provide the reinforcement board 43 on the board 42.

Next, referring to FIG. 32, the manufacturing method of the semiconductor device 40 for photographing will be described.

Although firstly the resin molded body 41B is formed, a detailed explanation thereof will be omitted, because the resin molded body 41B is formed by an equivalent method to the method of manufacturing of the housing 14A in the first embodiment of the present invention.

Figure 32:
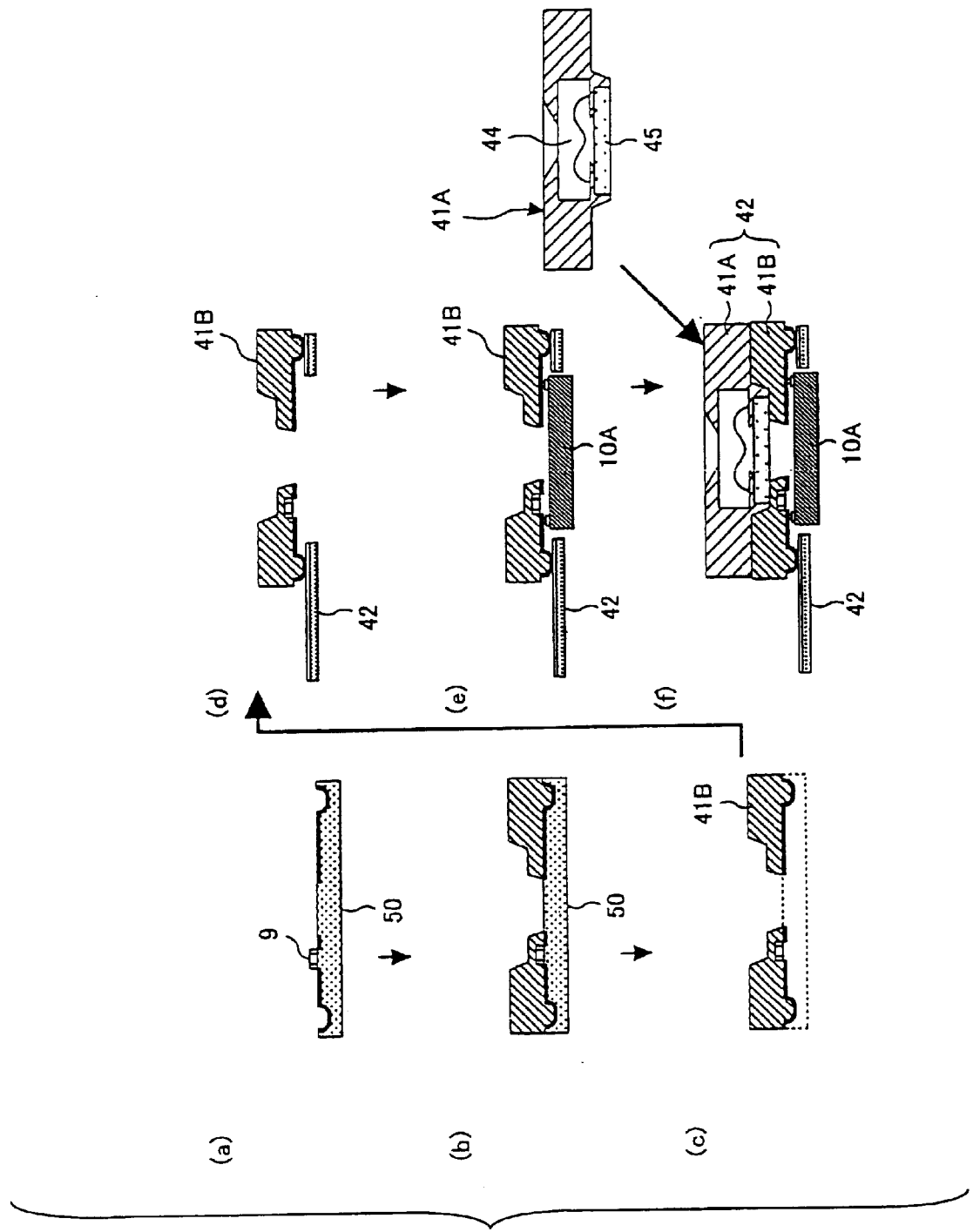
FIG. 32 is a view for explaining the manufacturing method of the semiconductor device for photographing shown in FIG. 27.

Processes of manufacturing of the resin molded body 41B are shown in FIG. 32-(a) to (c). As shown in FIG. 32-(a), a wire pattern is formed on a metal board 50 including a concave part in a position thereof which corresponds to the projection part of the resin molded body 41B, and the electronic parts 9 are mounted on the wire pattern. Next, as shown in FIG. 32-(b), the resin molded body 41B is formed by resin-molding. After that, as shown in FIG. 32-(c), the metal board 50 is eliminated.

Figure 33:
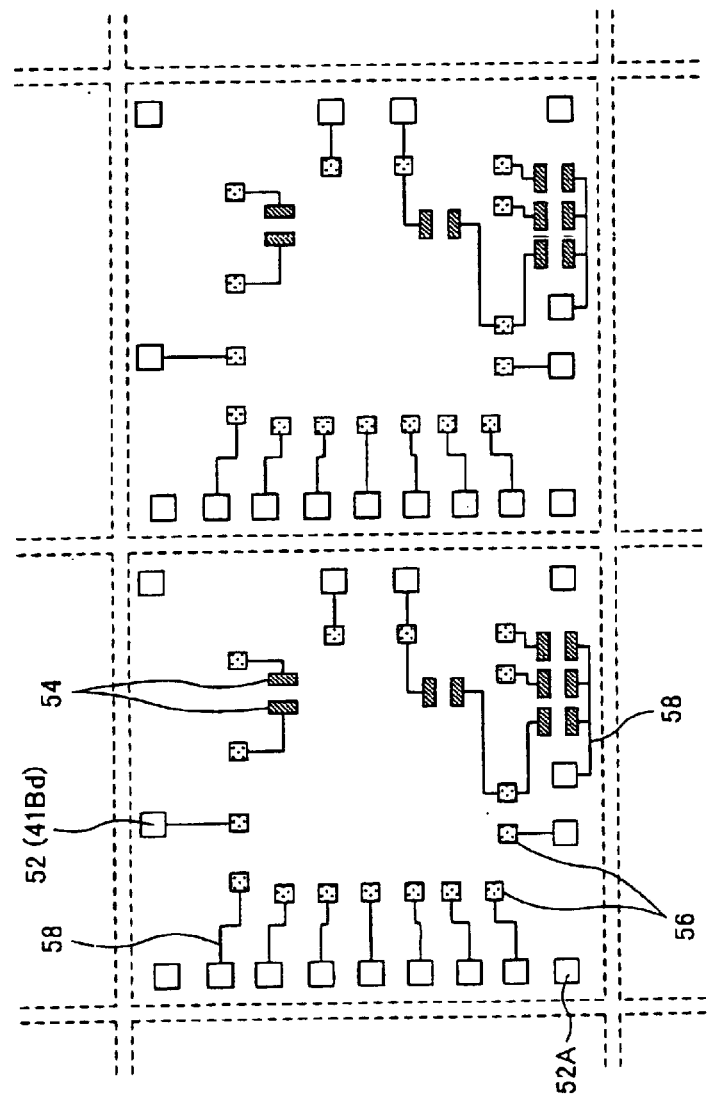
FIG. 33 is a plan view showing a metal board before electronic parts are mounted thereon.

Meanwhile, FIG. 33 is a plan view showing the metal boards 50 in a prior state where the electronic parts 9 are mounted thereon. A plurality of the metal boards 50 are formed on one whole metal board. Firstly, concave parts 52 corresponding to the projection parts 41Bc, and concave parts 52A corresponding to the dummy bumps, are formed on the whole metal board if necessary. And then, the outside connecting terminals 41Bd are formed on the concave parts 52 and the concave parts 52A, and electrode pads 54 for mounting the electronic devices 9 are formed on the whole metal board. Electrode pads 56 for connecting the solid-state image sensing chips 10A are formed on the whole metal board. Wire patterns 58 for connecting the electrode pads 56 with the electrode pads 54, the electrode pads 56 with the outside connecting terminals 41Bd, and the electrode pads 54 with the outside: connecting terminals 41Bd, are also formed on the whole metal board. The outside connecting terminals 41Bd, the electrode pads 54, the electrode pads 56, and the wire pattern 58 are formed by the same processes in which the resist is utilized as the processes in the above-described first embodiment of the present invention. After the electrode pads 54 and 56 and the wire pattern 58 are formed on the whole metal board, the whole metal board are cut to make pieces of the metal boards 50. Respective areas of the metal boards 50 are shown as surrounded areas by dotted lines in FIG. 33.

Figure 34:
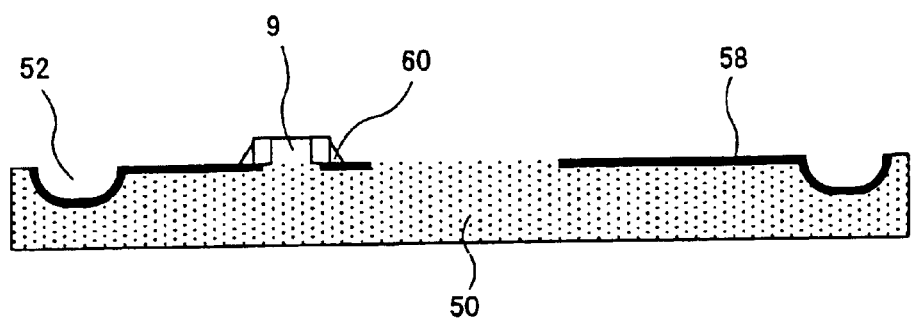
FIG. 34 is a cross-sectional view showing a metal board in a state where electronic parts are mounted thereon.

FIG. 34 is a cross-sectional view showing the metal boards 50 in a state where the electronic part 9 is mounted thereon. The electronic part 9 is connected with the electrode pads 54 by conductive pastes. While a solder is utilized as a conductive paste generally, a silver (Ag) paste 60 is utilized in this embodiment.

In this embodiment, the electrode pads 54 and 56 and the wire pattern 58 are, for example, plated with plating layers of palladium (Pd), nickel (Ni), palladium (Pd), gold (Au) from bottom to top. After the electronic part 9 is mounted on the electrode pads 54 by the conductive pastes, the resin molded body 41B is formed by resin-molding. And then, the metal board 50 is eliminated, thereby the electrode pads 54 and 56 and the wire pattern 58 are exposed.

In case of that the electronic part 9 is mounted to the electrode pads 54 by the solder, it may occur on a vicinity of a solder connection part that the electrode pads 54 and the wire pattern 58 are peeled off from the resin molded body 41B. In such case, it may be observed that a discoloration occurs in the vicinity of the solder connection parts of the electrode pad 54 and the wire pattern 58 after the electrode pad 54 and the wire pattern 58 are soldered. This discoloration may occur due to a chemical combination of ingredients of the wire pattern and the solder. Since such peeling frequently occurs at a position where the discoloration occurs, it is assumed that the peeling may be caused by the chemical combination of the ingredients of the wire pattern and the solder.

Because of this, in this embodiment, the electronic part 9 is connected by the silver (Ag) paste 60 which has been utilizing as a die bonding material from the past. It is confirmed that neither the discoloration occurring in case of that the solder is utilized nor the peeling occurs when the silver (Ag) paste is utilized for connecting the electronic part 9. Therefore, for connecting the electronic part 9, firstly a proper quantity of the silver (Ag) paste is applied on the electrode pad 54 formed on the metal board 50. Then, after the electronic part 9 is positioned on a designated position by a mounter, the silver (Ag) paste is heat-melted, thereby the electronic part 9 is completely fixed with the electrode pad 54.

Here, referring back to FIG. 32, the manufacturing method of the semiconductor device 40 for photographing will be continued describing.

The resin molded body 41B formed by the processes shown in FIG. 32-(*a*) to (*c*) is mounted to the board 42 as shown in FIG. 32-(*d*). At this time, the solid-state image sensing chips 10A has not been mounted to the resin molded body 41B yet. Next, as shown in FIG. 32-(*e*), the solid-state image sensing chips 10A is positioned at the opening part 42*a* of the board 42 and mounted to the resin molded body 41B by soldering. Lastly, the lens holder 41A in which the lens 44 for photographing and the IR filter 45 are provided is mounted and completely fixed by an adhesive or the like on the resin molded body 41B, thereby the semiconductor device 40 for photographing is completed.

In the above-mentioned manufacturing process, after the resin molded body 41B is mounted to the board 42, the solid-state image sensing chips 10A is mounted to the resin molded body 41B. Assuming that the solid-state image sensing chips 10A is mounted to the resin molded body 41B before the resin molded body 41B is mounted to the board 42, a mounting process of the resin molded body 41B is implemented in case where the light-receiving surface 10Aa of the solid-state image sensing chip 10A is exposed.

Since the mounting process of the resin molded body 41B includes a reflow process of the solder, there is high possibility that a dust or a foreign body is stuck to the light-receiving surface 10Aa of the solid-state image sensing chip 10A in a reflow hearth. Since a light for photographing is incident on the light-receiving surface 10Aa of the solid-state image sensing chip 10A, an adhesion of the dust or the foreign body on the light-receiving surface 10Aa may give a bad-influence to pictures.

In order to prevent such adhesion of the dust or the foreign body, in this embodiment, after a board mounting process in which the resin molded body 41B is mounted to the board 42, an image sensing chip mounting process in which the solid-state image sensing chip 10A is mounted to the resin molded body 41B is implemented. Because of this, it is possible to reduce a time in which the light-receiving surface 10Aa of the solid-state image sensing chip 10A is exposed to an outside atmosphere, thereby a reduction of a yield rate of a product due to the adhesion of the dust is prevented.

Furthermore, a heat-resistance temperature of the solid-state image sensing chip 10A is generally approximately 230° C. which is close to a temperature of a melting point of an eutectic solder which is approximately 220 to 230° C. Therefore, when the resin molded body 41B is mounted to the board 42 after the solid-state image sensing chip 10A is mounted to the resin molded body 41B, the eutectic solder cannot be utilized. In this case, rather, a solder having a lower melting point such as approximately 180° C. than a melting point of the eutectic solder, such as a lead free solder, must be utilized. A connect ability of the lead free solder is lower than a connect ability of the eutectic solder. Therefore, a reliability of a product in which the lead free solder is utilized may be low. However, according to this embodiment of the present invention, as described above, after the board mounting process in which the resin molded body 41B is mounted to the board 42, the image sensing chip mounting process in which the solid-state image sensing chip 10A is mounted to the resin molded body 41B is implemented. Hence, it is possible to utilize various connection materials including the eutectic solder when the resin molded body 41B is mounted to the board 42.

Next, referring to FIG. 35, a semiconductor device for photographing according to a fifth embodiment of the present invention will be described. In the semiconductor device for photographing according to the fifth embodiment, a semiconductor element having a photographing function and a semiconductor element having a control function to control the photographing function are provided separately.

In the above described embodiment, the circuit having a control function to control the solid-state image sensing chip is formed in the semiconductor chip in which the solid-state image sensing chip is formed. According to the above described embodiment, the size of the circuit having the control function must become large in order to increase the resolution of the semiconductor device for photographing. Hence, the size of the semiconductor chip in which the solid-state image sensing chip is formed must become large. Therefore, a problem due to making a large size of the semiconductor chip may occur.

In addition, it is not preferable to form a sensor function (photographing function) and the control function on one semiconductor chip together because of a difference of manufacturing processes. That is, there is a difference with respect to a rule for the wiring process and a surface process between the sensor function (photographing function) and the control function. For instance, a color filter and a micro lens are necessary for a part having the sensor function and such functional parts are not necessary for a part having the control function.

Considering the above described problem, the sensor function and the control function are formed as separated semiconductor chips and provided to the semiconductor device for solid-state image sensing separately, so that the solution of the semiconductor device for photographing arises.

Figure 35A:
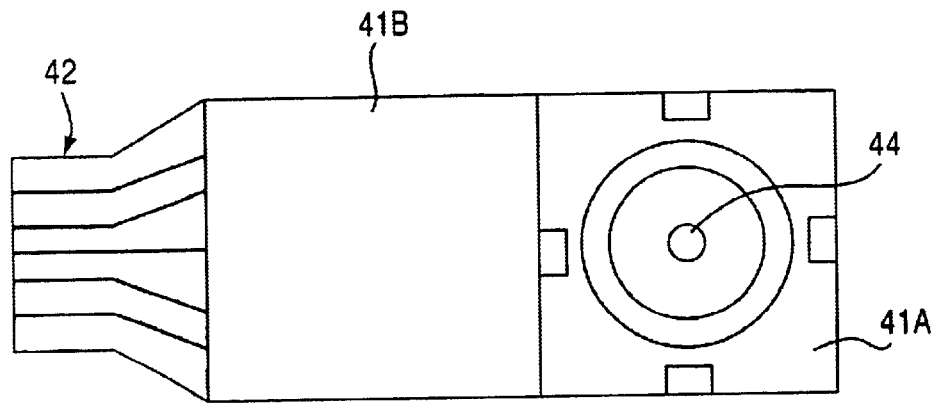
FIG. 35-(a) is a plan view showing the semiconductor device for solid-state image sensing according to the fifth embodiment of the present invention and FIG. 35-(b) is a cross-sectional view showing the semiconductor device for solid-state image sensing according to the fifth embodiment of the present invention.
Figure 35B:
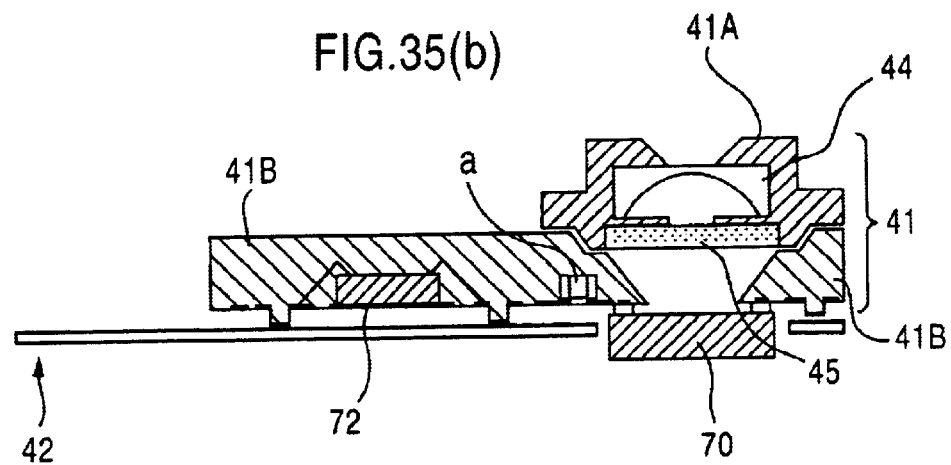

FIG. 35-(a) is a plan view showing the semiconductor device for solid-state image sensing according to the fifth embodiment of the present invention and FIG. 35-(b) is a cross-sectional view showing the semiconductor device for solid-state image sensing according to the fifth embodiment of the present invention. In FIG. 35, parts that are the same as the parts shown in FIG. 27 are given the same reference numerals, and explanation thereof will be omitted.

In this embodiment, the solid-state image sensing chip 70 is formed as a semiconductor chip having only the sensor function (photographing function). In addition, the semiconductor chip 72 for controlling is separately provided in the housing 41 in order to control the sensor function of the solid-state image sensing chip 70.

The solid-state image sensing chip 70 is mounted to the resin molded body 41B of the housing 41 as well as the solid-state image sensing chip 10A shown in FIG. 27. In addition, the semiconductor chip 72 for controlling is provided in the resin molded body 41B as well as the electronic part 9 shown in FIG. 23. Therefore, the solid-state image sensing chip 70 and the semiconductor chip 72 for controlling are electrically connected by a wire pattern 58 (See FIG. 34.) formed in the resin molded body 41B. Furthermore, the electronic part 9 such as a condenser is also provided in the resin molded body 41B. A function as a semiconductor device for photographing is achieved by the solid-state image sensing chip 70, the semiconductor chip 72 for controlling, and the electronic part 9.

In the semiconductor device for photographing shown in FIG. 35, the semiconductor chip 72 for controlling is molded in the resin molded body 41B as well as the electronic part 9. It is possible to mold the semiconductor chip 72 in the resin molded body 41B easily by using the method described with reference to FIG. 32 in the above mentioned third embodiment. That is, the semiconductor chip 72 for controlling is mounted together with the electronic part 9 in the process for mounting the electronic part 9 shown in FIG. 32, so that an electrode of the semiconductor chip 72 for controlling is mounted on the wire pattern on the metal board 50. The process following the above mentioned process is similar with the process shown in FIG. 32 and explanation thereof will be omitted.

As described above, in this embodiment, the semiconductor chip for photographing is divided into the solid-state image sensing chip 70 only for the photographing function and the semiconductor chip 72 only for the controlling function. As a result, a proper manufacturing method can be applied individually to the respective chips. Therefore, the chips 70 and 72 can be manufactured efficiently. Hence, a semiconductor device for photographing having high functions can be manufactured without making a large size of the respective chips. In addition, the solid-state image sensing chip 70 only for the photographing function, the semiconductor chip 72 only for the controlling function, and the electronic part 9 are arranged closely through one resin molded body 41B and connected to each other, so that a semiconductor device for photographing having a small size can be provided by a small number of assembly processes.

Next, other modified examples of the fifth embodiment of the present invention will be described.

Figure 36:
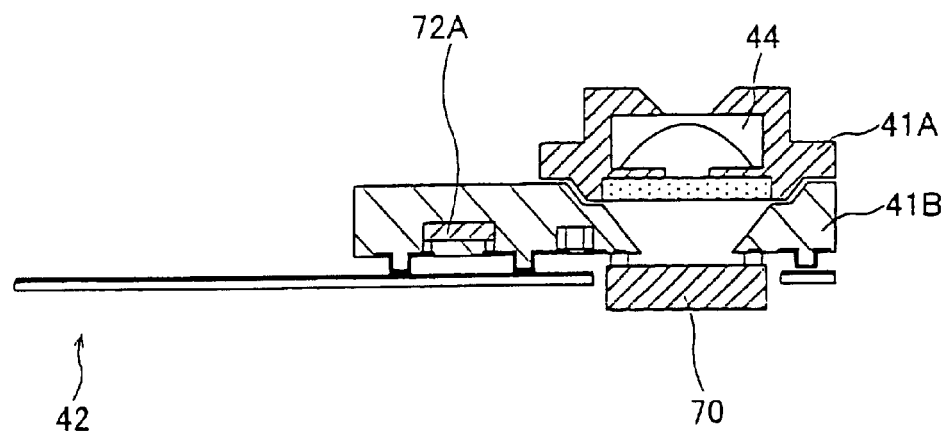
FIG. 36 is a cross-sectional view of a first modified example of the fifth embodiment of the present invention.

FIG. 36 is a cross-sectional view of a first modified example of the fifth embodiment of the present invention. Although the semiconductor chip 72 for controlling is mounted by wire bonding in the semiconductor device for solid-state image sensing shown in FIG. 35, the semiconductor chip 72 for controlling is mounted by flip chip bonding in the first modified example of the fifth embodiment. As a result, it is possible to reduce a mounted area of the semiconductor chip for controlling, so that a height of a part where the semiconductor chip for controlling is mounted can be reduced.

Figure 37:
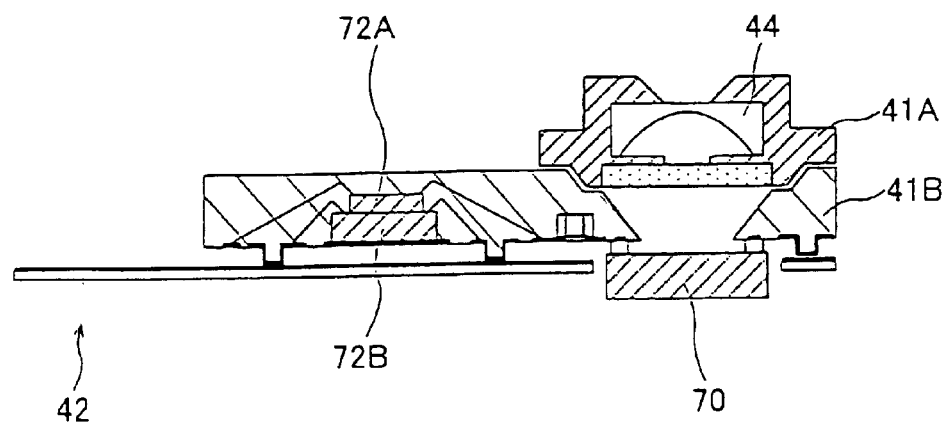
FIG. 37 is a cross-sectional view of a second modified example of the fifth embodiment of the present invention.

FIG. 37 is a cross-sectional view of a second modified example of the fifth embodiment of the present invention. In the second modified embodiment shown in FIG. 37, the semiconductor chip having a control function is divided into the semiconductor chips 72A and 72B for controlling, so that the chip 72B is stacked and mounted on the chip 72A. As a result, it is possible to reduce a mounted area of the semiconductor chip for controlling, so that more functions can be provided in the semiconductor device for solid-state image sensing.

Figure 38:
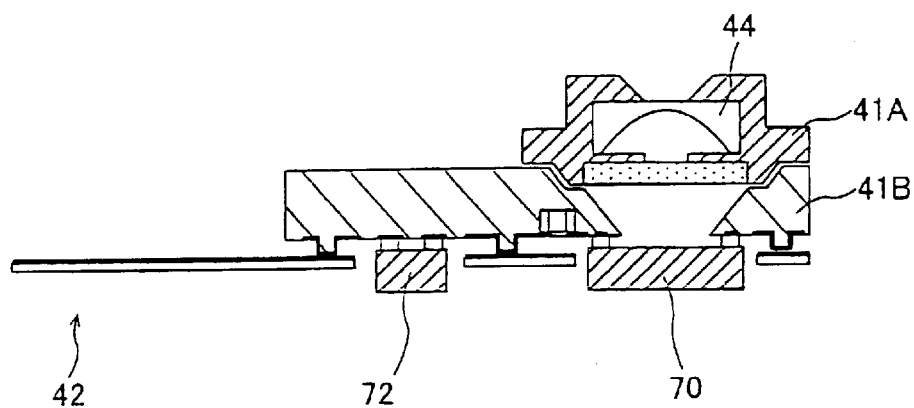
FIG. 38 is a cross sectional view of a third modified example of the fifth embodiment of the present invention.

FIG. 38 is a cross sectional view of a third modified example of the fifth embodiment of the present invention. In the third modified embodiment shown in FIG. 38, the semiconductor chip 72 for controlling is not molded in the resin molded body 41B. Rather, the semiconductor chip 72 for controlling is molded on a bottom surface of the resin molded body 41B by flip chip mounting. In this case, it is necessary to provide opening parts corresponding to the position where the semiconductor chip 72 for controlling is mounted, at the board 42, as well as the structure in which the solid-state image sensing chip 70 is mounted.

Figure 39:
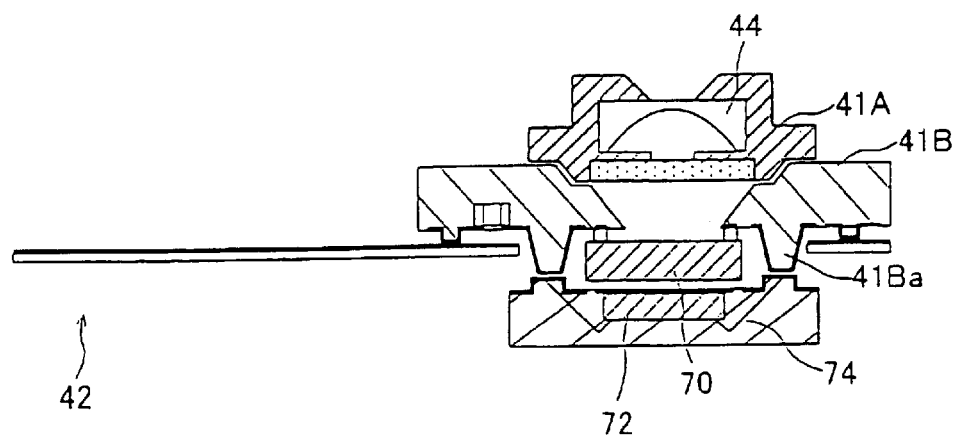
FIG. 39 is a cross sectional view of a fourth modified example of the fifth embodiment of the present invention.

FIG. 39 is a cross sectional view of a fourth modified example of the fifth embodiment of the present invention. In the fourth modified example shown in FIG. 39, the semiconductor chip 72 for controlling is not molded in the resin molded body 41B. Rather, a second resin molded body 74 inside of which the semiconductor chip 72 for controlling is provided, is mounted to the resin molded body 41B. It is preferable that the second resin molded body 74 is arranged under the solid-state image sensing chip 70 as shown in FIG. 39.

In order to arrange the second resin molded body 74 under the solid-state image sensing chip 70, a projection part 41Ba having a relatively high projection height is formed around a part where the solid-state image sensing chip 70 is mounted, at the resin molded body 41B. The projection part 41Ba is formed by a substantially same method as the method for the projection part 14Ba shown in FIG. 19 of the second embodiment. In addition, the second resin molded body 74 is manufactured by a substantially same method as the method for the resin molded body 41B.

Next, referring to FIG. 40, a semiconductor device for solid-state image sensing according to a sixth embodiment of the present invention will be described. The semiconductor device for solid-state image sensing has a structure in which the solid-state image sensing chip is provided to a resin housing on which a lens is mounted and the resin housing is mounted on the board.

Figure 40:
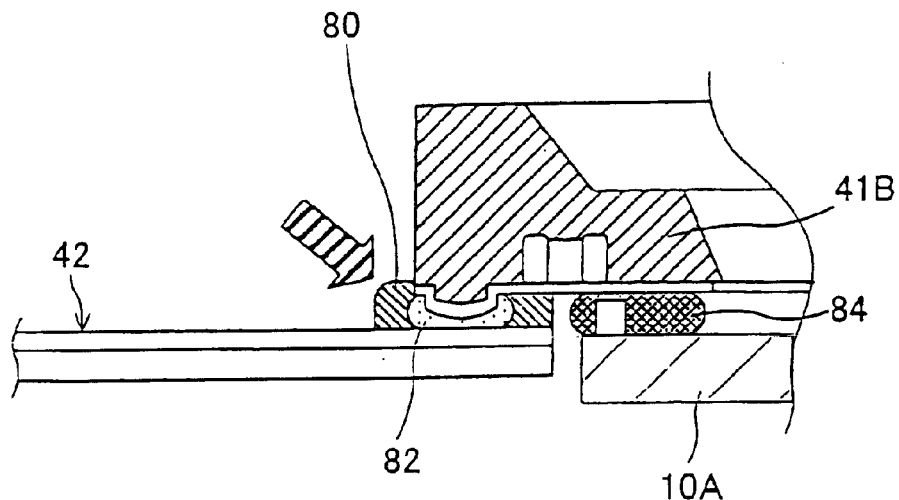
FIG. 40 is a cross-sectional view showing a part of the semiconductor device for solid-state image sensing of the sixth embodiment of the present invention.

FIG. 40 is a cross-sectional view showing a part, of the semiconductor device for solid-state image sensing of the sixth embodiment of the present invention. In FIG. 40, parts that are the same as the parts shown in FIG. 27 are given the same reference numerals, and explanation thereof will be omitted. FIG. 40 particularly shows a connection part between the resin molded body 41B comprising the resin housing 41 and the solid-state image sensing chip 10A and a connection part between the resin molded body 41B and the board 42.

The solid-state image sensing chip 10A is mounted to the wire pattern exposed on the bottom surface of the resin molded body 41B by flip chip mounting with non conductive paste (NCP). In addition, the projection electrode (resin bump) is formed on the bottom surface of the resin molded body 41B. The resin molded body 41B is mounted to the wire pattern of the board 42 by soldering and others An underfill material 80 is poured into and fills up between the board 42 and the resin molded body 41B. As the underfill material 80, an epoxy resin having a strong adhesive force is preferable.

As described above, it is possible to reinforce a connection between the resin molded body 41B and the board 42 by filling up with the underfill material 80 between the board 42 and the resin molded body 41B. Thus, in a case where a flexible board is used as the board 42, when the flexible board is bent repeatedly, an incorrect-connection due to the deterioration of the soldering connection part can be prevented. Particularly, the resin housing to which the lens for photographing is provided is generally exposed on a surface of the electronic device. In this case, an external force is applied to the resin housing so that the board 42 is bent. Damage due to the deterioration of the soldering connection part can be prevented from being generated by reinforcing the soldering connection part of the resin bump of the resin molded body 41B with the underfill material 80.

A structure shown in FIG. 40 is made by the following method. First, the solder paste is applied to the board 42 such as a flexible board by using the solder paste with a mask. In addition, the molded body 41B comprising the resin housing is mounted to the board 42 by a mounting machine. After that, the resin bump of the molded body 41B is solder-connected to a circuit pattern of the board 42 by a reflow hearth.

After the molded body 41B is mounted to the board 42, a connection material 84 made of non conductive paste (NCP), non conductive film (NCF) or others is arranged at a chip mount area of the molded body 41B, and the solid-state image sensing chip 10A is mounted by the mounting machine. After that, an underfill material of the epoxy group is poured between the molded body 41B and the board 42 and solidifies. As a result, the molded body 41B is fixed to the board 42 strongly and thereby a connection of the soldering connection part is reinforced.

According to the above described method, the solid-state image sensing chip 10A is connected to the molded body 41B after the resin bump of the molded body 41B is solder connected to the circuit pattern of the board 42, so that heat at the time of solder flowing is prevented from influencing the solid-state image sensing chip 10A or the molded body 41B. For example, the NCP or others as the connection material 84 has a temperature of a heat resistant of 150° C. lower than a temperature at the time of solder flow.

Figure 41:
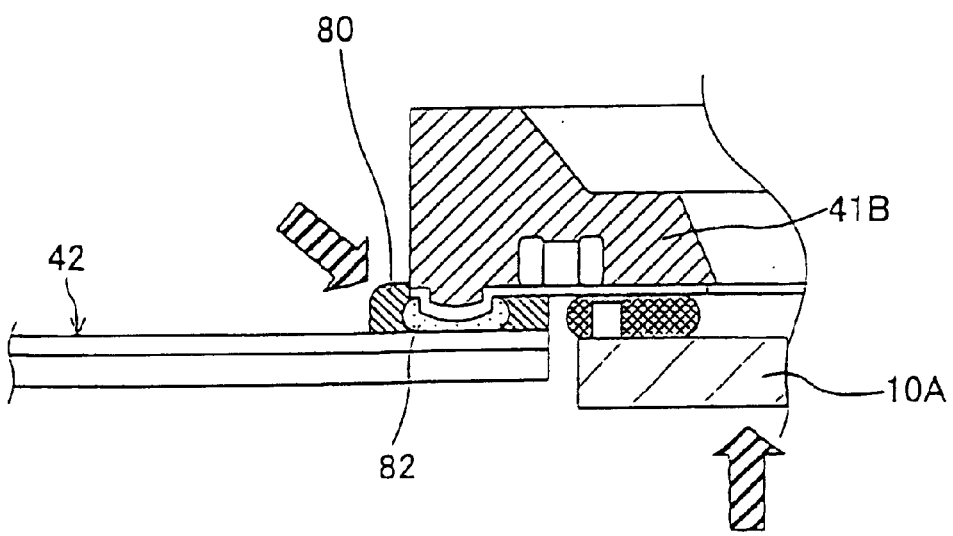
FIG. 41 is a cross sectional view showing a first modified example of the semiconductor device for solid-state image sensing of the sixth embodiment.

FIG. 41 is a cross sectional view showing a first modified example of the semiconductor device for solid-state image sensing of the sixth embodiment. In the first modified example, the underfill material 80 is used for mounting the solid-state image sensing chip 10A, instead of the connection material 84. That is, after the solder bump of the molded body 41B is solder connected to the circuit pattern of the board 42, the underfill material 80 is poured between the molded body 41B and the board 42, and at the same time the underfill material 80 is supplied to the chip mounting area of the molded body 41B. After that, the solid-state image sensing chip 10A is mounted by press contact bonding and the underfill material 80 solidifies. Accordingly, in the first modified example shown in FIG. 41, a process in which the connection material 84 for connecting the solid-state image sensing chip 10A is supplied can be omitted.

Figure 42:
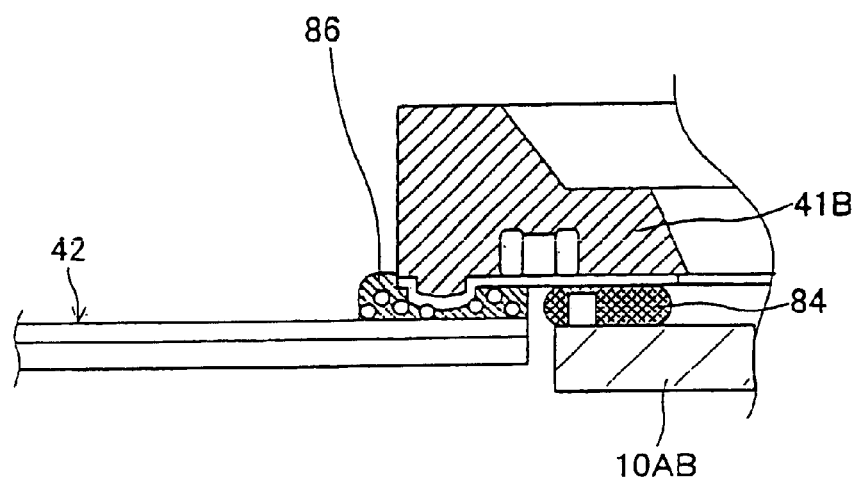
FIG. 42 is a cross sectional view showing a second modified example of the semiconductor device for solid-state image sensing of the sixth embodiment.

FIG. 42 is a cross sectional view showing a second modified example of the semiconductor device for solid-state image sensing of the sixth embodiment. In the second modified example, a connection material 86 made of anisotropic conductive paste (ACP) instead of the underfill material 80 is used for mounting the molded body 41B to the board 42.

A structure shown in FIG. 42 is made by the following method. First, the connection material 86 made of anisotropic conductive resin is applied to an area where the molded body 41B of the board 42 made of the flexible board is mounted. Then, the molded body 41B is mounted to the board 42 by the mounting machine. After the molded body 41B is mounted to the board 42 by the mounting machine, the connection material 84 made of non conductive paste (NCP), non conductive film (NCF), or others is arranged at the chip mounting area of the molded body 41B and the solid-state image sensing chip 10A is mounted by the mounting machine. The molded body 41B is fixed to the board 42 strongly by a connection material 86. Since the solder connection is not used in this modified example, a problem due to the deterioration of the solder connection part does not occur. Furthermore, a process for solder connection can be omitted.

Figure 43:
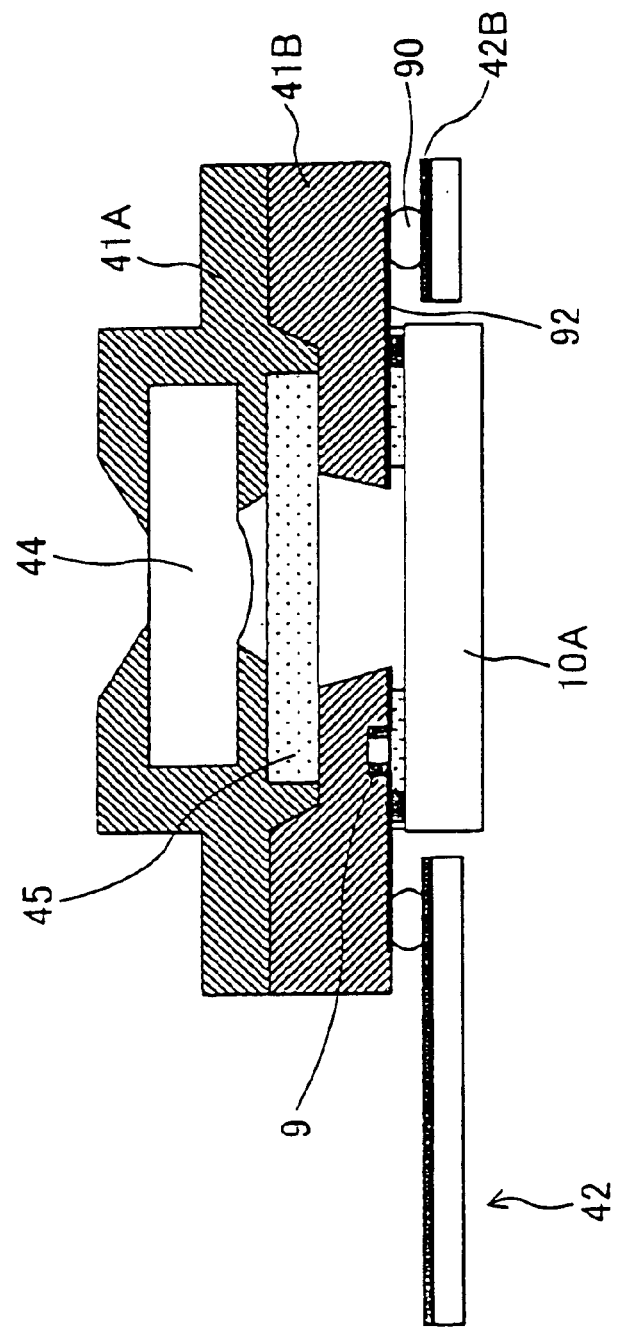
FIG. 43 is a cross-sectional view of the semiconductor device for photographing of the seventh embodiment of the present invention.

Next, referring to FIG. 43, a semiconductor device for photographing according to a seventh embodiment of the present invention will be described. In the semiconductor device for photographing according to the seventh embodiment, a solder ball is used for connecting the molded body and the board of the fourth embodiment of the present invention. FIG. 43 is a cross-sectional view of the semiconductor device for photographing of the seventh embodiment of the present invention. In FIG. 43, parts that are the same as the parts shown in FIG. 27 are given the same reference numerals, and explanation thereof will be omitted.

In FIG. 43, a wire pattern exposed on the bottom surface of the molded body 41B is connected to the wire pattern of the board 42 through the solder ball 90. In this embodiment, the resin bump is not formed on the bottom surface of the molded body 41B, rather the bottom surface is formed as a plane surface. Therefore, the wire pattern exposed on the bottom surface of the molded body 41B is also plane. In this embodiment, the plane wire pattern exposed on the bottom surface of the molded body 41B is connected with the wire pattern 42B of the board 42 by the solder ball 90.

The solder ball 90 is preferably provided on the electrode pad formed by the wire pattern 92 of the molded body 41B in advance. The molded body 41B in which the solder ball 90 is provided is arranged at a designated position of the board 42 and the solder ball is caused to reflow, so that the wire pattern 92 of the molded body 41B and the wire pattern 42B of the board 42 are solder connected. Furthermore, a solder resist may be formed on the bottom surface of the molded body in advance if necessary.

Figure 44:
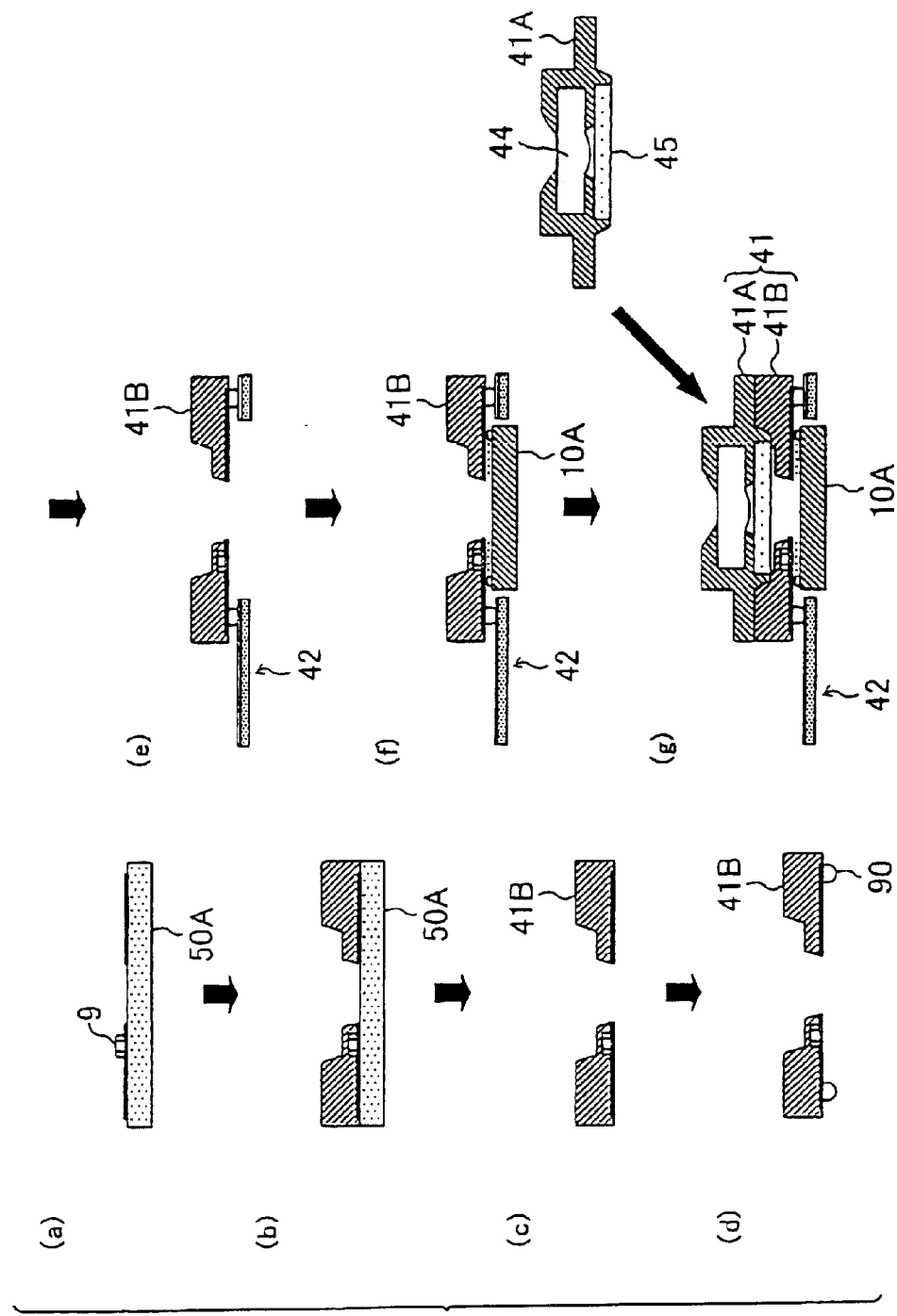
FIG. 44 is a view for explaining a manufacturing process of the semiconductor device for photographing shown in FIG. 43.

FIG. 44 is a view for explaining a manufacturing process of the semiconductor device for photographing shown in FIG. 43. First, the molded body 41B is formed. Since the molded body 41B can be formed by a substantially same method as the manufacturing method of the housing 14A of the first embodiment described above, explanation thereof will be omitted. Processes shown in FIG. 44-(a) through (c) are processes for manufacturing the molded body 41B. As shown in FIG. 44-(a), the wire pattern is formed on a plane surface of the metal board 50A and the electronic part 9 such as a condenser is mounted. Then, as shown in FIG. 44-(b), the molded body 41B is formed by resin molding. After that, as shown in FIG. 44-(c), the metal board 50A is removed by etching. As a result, the wire pattern formed on a plane surface of the metal board 50A is exposed on the bottom surface of the molded body 41B. The bottom surface of the molded body 41B is plane and the wire pattern is also plane.

Next, as shown in FIG. 44-(d), the solder ball 90 is formed as a mount terminal to the wire pattern exposed on the bottom surface of the molded body 41B. The solder ball 90 is formed by a method such as transcribing the solder ball prepared in advance, a method for forming a ball configuration based on the reflow following a solder plating, or a method for forming a ball configuration based on the reflow following after forming a bump with solder wire.

As shown in FIG. 44-(e), the molded body 41B to which the solder ball 90 is provided is mounted to the board 42. In this case, the solid-state image sensing chip 10A is not mounted to the molded body 41B. Next, as shown in FIG. 44-(f), the solid-state image sensing chip 10A is mounted to the molded body 41B by arranging the solid-state image sensing chip 10A at the opening part 42A of the board 42. Last, the lens holder 41A to which the lens 44 for photographing and the IR filter 45 are provided is mounted to the molded body 41B and fixed by an adhesive or others, so that the semiconductor device for photographing can be completed.

In the above described manufacturing process, when the molded body 41B is formed, the plane metal board 50A is used. Hence, it is not necessary to form a concave part for forming the resin bump on the plane surface. Here, a meaning of "plane" does not include the concave or convex part. More concretely, the meaning of "plane" is defined as what the concave part forming the resin bump is not formed. Therefore, the process for forming the concave part for the resin bump on the metal board 50A can be omitted, so that the manufacturing process can be simplified.

Figure 45:
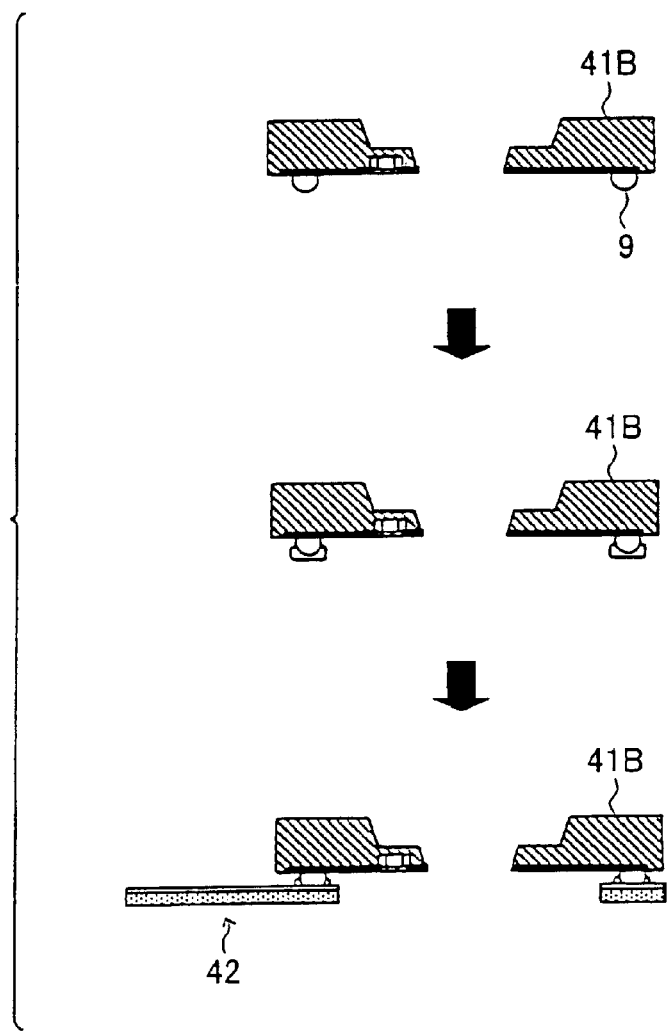
FIG. 45 is a view for explaining a solder paste transcription process to the resin molded body according to the present invention.
Figure 46:
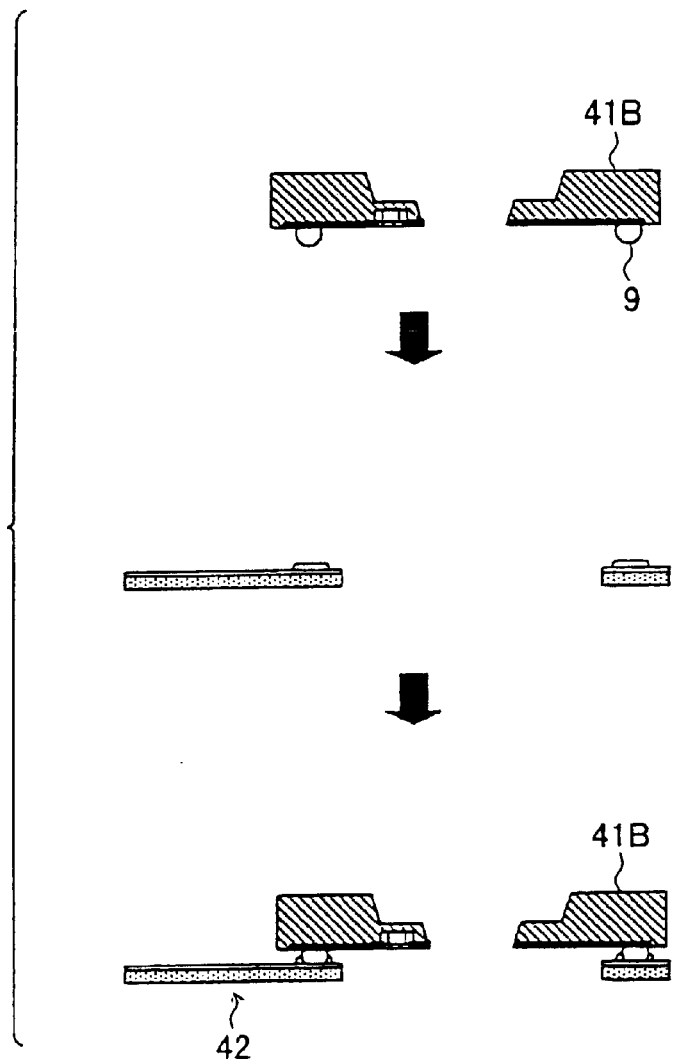
FIG. 46 is a view for explaining a solder paste application process to the board according to the present invention.

In this manufacturing method, when the molded body 41B is mounted to the board 42, as shown in FIG. 45, the solder paste may be transcribed to the solder paste 90 in advance and by such the molded body 41B may be mounted to the board 42. Alternatively, as shown in FIG. 46, after the solder paste is print applied on the board 42 by a metal mask method in advance, the molded body 41B may be mounted to the board 42.

Figure 47:
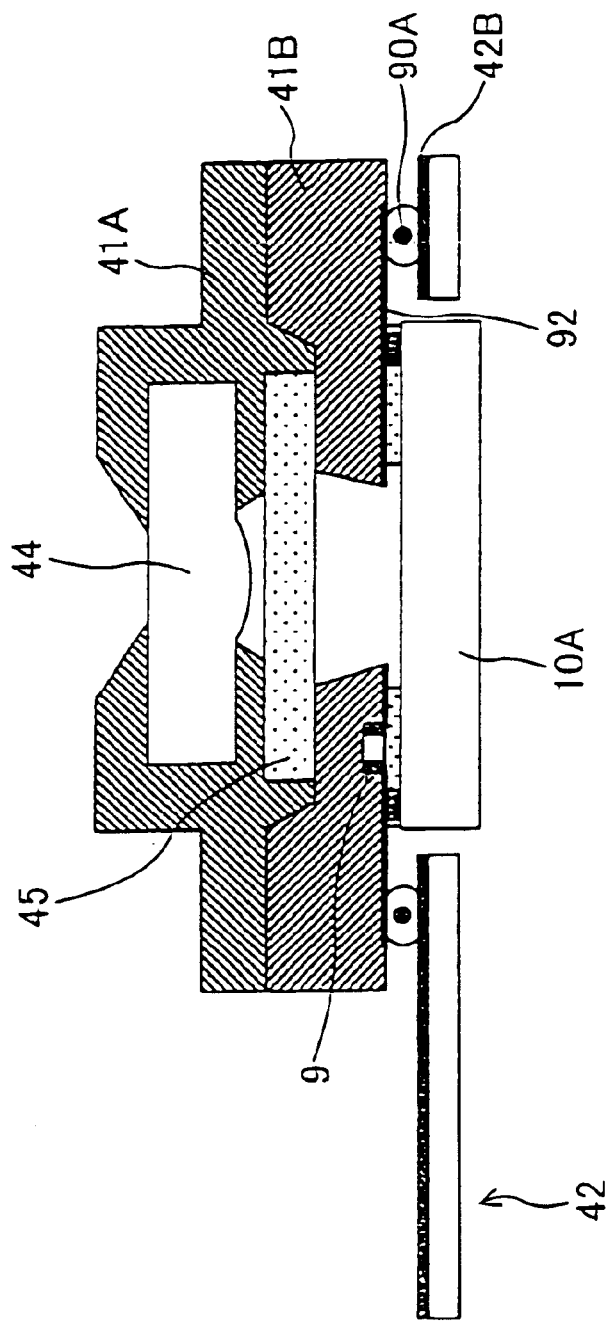
FIG. 47 is a cross-sectional view of a first example of the semiconductor device for solid-state image sensing of the seventh embodiment.

FIG. 47 is a cross-sectional view of a first example of the semiconductor device for solid-state image sensing of the seventh embodiment. In the first example shown in FIG. 47, a copper core solder ball 90A is used instead of the solder ball 90. The copper core solder ball 90A has a structure in which a copper ball is provided in the solder ball. When a normal solder ball has a same size as a size of the copper core solder ball, an amount of the solder in the copper core solder ball is less than the normal solder ball by an amount of the copper ball. The copper core solder ball is improved to reduce the amount of lead in the solder, reducing a cause of environmental contamination.

The ball having the solder as a main element such as the first example or the seventh embodiment can be obtained with a relatively low price, so that a cost for manufacturing the whole semiconductor device using the ball can be reduced. Since there are many kinds of the ball having the solder as the main element in terms of a melting point, the solder ball having a different melting point based on the environment conditions at time of use can be selected without limitation. There are limitations such as a flip chip mount temperature of the solid-state image sensing chip, an electric connection temperature (a melting point of the connection material) of the electronic part molded in the resin molded body and the wire pattern, a mount temperature of the board, as environmental conditions, for example.

Figure 48:
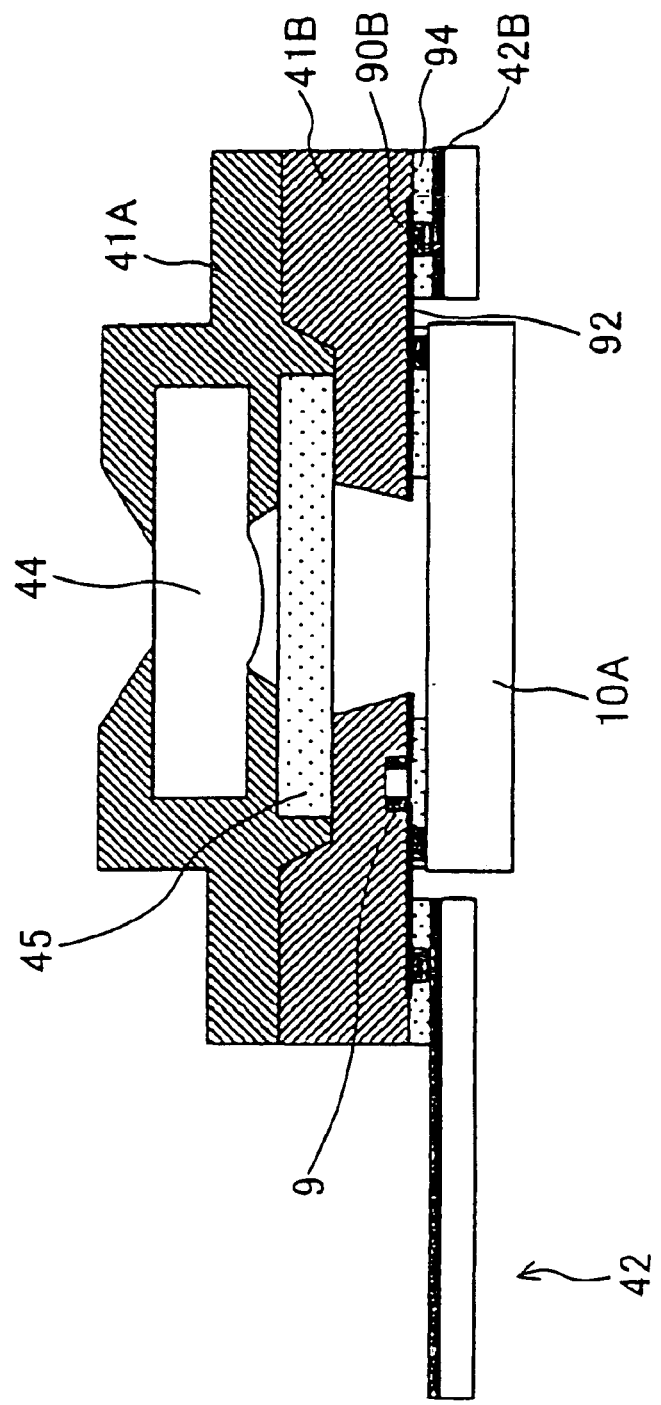
FIG. 48 is a cross-sectional view of a second modified example of the semiconductor device for solid-state image sensing of the seventh embodiment.

FIG. 48 is a cross-sectional view of a second modified example of the semiconductor device for solid-state image sensing of the seventh embodiment. In the second modified example shown in FIG. 48, a gold bump 90B is used instead of the solder ball 90. The gold bump 90B can be easily formed on the wire pattern of the molded body 41B by a wire bumping which is a method for forming the bump with wire bonding. The molded body 41B is preferably mounted to the board through non-conductive paste (NCP), anisotropic conductive paste (ACP), anisotropic conductive film (ACF) or others, so that the reliabilty of the mounting can be improved.

The bump having gold as a main element such as the gold bump 90B can be formed to have a much smaller size than the resin bump. Accordingly, it becomes easy to design a leading of the wire pattern transcribed on the bottom surface of the molded body. In addition, it is possible to miniaturize the semiconductor device itself. Furthermore, the bump having the gold as a main element has a mounting height of 30 $\mu$m through 60 $\mu$m which is shorter than a mounting height of the resin bump of 70 $\mu$m through 100 $\mu$m, so that it is possible to reduce the height of the semiconductor device.

As described above, in this embodiment, the mount terminal made of metal is formed on the plane bottom surface of the molded body 41B separately as a mount terminal of the molded body 41B. In addition, the molded body 41B is mounted to the board 42 through the metal mount terminal. Therefore, in the process for forming the molded body 41B, a process for forming a resin bump is not necessary so that a manufacturing process can be simplified.

The present invention is not limited to these embodiments, but various variations and modifications may be made without departing from the scope of the present invention.

The patent application is based on Japanese priority patent applications No. 2001-055735 filed on Feb. 28, 2001, No. 2001-315672 filed on Oct. 12, 2001, and No. 2002-44322 filed on Feb. 21, 2002 the entire contents of which are hereby incorporated by reference.

What is claimed is:

1. A semiconductor device comprising:
    a resin housing provided with a functional part;
        a wire pattern made of a conductive material and molded in the resin housing, a part of the wire pattern being exposed from the resin housing;
        an electronic part connected with the wire pattern in a state where the electronic part is molded in the resin housing; and
        a semiconductor element connected to the part of the wire pattern exposed from the resin housing,
        wherein a functional part provided at the resin housing is a lens for photographing,
        wherein the semiconductor element is flip chip mounted to the part of the wire pattern exposed from the resin housing.

2. The semiconductor device as claimed in claim 1, wherein the part of the wire pattern exposed from the resin housing projects from a surface of the resin housing.

3. A semiconductor device comprising:
    a resin housing provided with a functional part;
    a wire pattern made of a conductive material and molded in the resin housing, a part of the wire pattern being exposed from the resin housing;
    an electronic part connected with the wire pattern in a state where the electronic part is molded in the resin housing; and
    a semiconductor element connected to the part of the wire pattern exposed from the resin housing,
    wherein a functional part provided at the resin housing is a lens for photographing,
    wherein the resin housing comprises a projection part projecting to the semiconductor chip side around the semiconductor element and the part of the wire pattern exposed from the resin housing exposes on a surface of the projection part.

4. The semiconductor device as claimed in claim 3, wherein a distance between a surface of the wire pattern connected with the semiconductor chips and an end of the projection is longer than a distance between the surface of the wire pattern connected with the semiconductor chips and a back surface of the semiconductor device.

5. A semiconductor device comprising:
    a resin housing provided with a functional part;
    a wire pattern made of a conductive material and molded in the resin housing, a part of the wire pattern being exposed from the resin housing;
    an electronic part connected with the wire pattern in a state where the electronic part is molded in the resin housing; and
    a semiconductor element connected to the part of the wire pattern exposed from the resin housing,
    wherein a functional part provided at the resin housing is a lens for photographing,
    wherein the resin housing comprises a projection part projecting directly under the electronic part and a part of the wire pattern extends at the projection part in a molded state.

6. The semiconductor device as claimed in claim 1, wherein the wire pattern is formed by metal plating.

7. The semiconductor device as claimed in claim 1, wherein the wire pattern is formed by a conductive resin.

8. A semiconductor device comprising:
    a resin housing provided with a functional part;
    a wire pattern made of a conductive material and molded in the resin housing, a part of the wire pattern being exposed from the resin housing;
    an electronic part connected with the wire pattern in a state where the electronic part is molded in the resin housing; and
    a semiconductor element connected to the part of the wire pattern exposed from the resin housing,
    wherein the functional part comprises a lens for photographing, the semiconductor element is a solid-state image sensing chip having a light-receiving surface, and the lens for photographing and the solid-state image sensing chip are arranged on the resin housing in a state where a light passing through the lens for photographing is incident on the light-receiving surface of the solid-state image sensing chip.

9. The semiconductor device as claimed in claim 8, wherein the functional part further comprises a filter having an aperture on a surface thereof, and wherein the filter is provided at the resin housing in a state where the filter is arranged between the lens for photographing and the semiconductor element.

10. A semiconductor device for photographing comprising:
    a resin housing having an opening extending between an upper surface of the resin housing and a bottom surface of the housing;
    a wire pattern made of a conductive material and molded in the resin housing, a part of the wire pattern being exposed on the bottom surface of the resin housing;
    an electronic part connected with the wire pattern in a state where the electronic part is molded in the resin housing;
    a solid-state image sensing chip which is flip chip mounted to the part of the wire pattern being exposed on the bottom surface of the resin housing; and
    a lens for photographing which is mounted on an upper face of the housing;
    wherein the lens for photographing and the solid-state image sensing chip are arranged in a state where a light passing through the lens for photographing is incident on a light-receiving surface of the solid-state image sensing chip through the opening of the resin housing.

11. The semiconductor device for photographing as claimed in claim 10, further comprising a filter having an aperture on a surface thereof, and wherein the filter is provided in the opening of the resin housing in a state where the filter is arranged between the lens for photographing and the semiconductor element.

12. A method for manufacturing a semiconductor device comprising the steps of:
    forming a wire pattern made of a conductive material on a metal board;
    connecting an electronic part with the wire pattern;
    forming a resin housing in which the electronic part and the wire pattern are molded by encapsulating the electronic part and the wire pattern on the metal board;
    attaching a functional part provided at the resin housing which is a lens for photographing;
    exposing a part of the wire pattern by removing the metal board from the resin housing;
    connecting a semiconductor element to the exposed part of the wire pattern; and
    attaching a functional part to the resin housing, the functional part providing a designated function in cooperation with the semiconductor element.

13. A method for manufacturing a semiconductor device comprising the steps of:

forming a wire pattern made of a conductive material on a metal board;

connecting an electronic part with the wire pattern;

forming a resin housing in which the electronic part and the wire pattern are molded by encapsulating the electronic part and the wire pattern on the metal board;

exposing a part of the wire pattern by removing the metal board from the resin housing;

connecting a semiconductor element to the exposed part of the wire pattern; and attaching a functional cart to the resin housing, the functional part providing a designated function in cooperation with the semiconductor element, wherein a dimple part is formed on the metal board prior to the step of forming the wire pattern so that the part of the wire pattern is arranged in the dimple part.

14. A method for manufacturing a semiconductor device comprising the steps of:

forming a wire pattern made of a conductive material on a metal board;

connecting an electronic part with the wire pattern;

forming a resin housing in which the electronic part and the wire pattern are molded by encapsulating the electronic part and the wire pattern on the metal board;

exposing a part of the wire pattern by removing the metal board from the resin housing;

connecting a semiconductor element to the exposed part of the wire pattern; and attaching a functional part to the resin housing, the functional part providing a designated function in cooperation with the semiconductor element, wherein a dimple part is formed on the metal board by bending prior to the step of forming the wire pattern so that the part of the wire pattern is arranged in the dimple part.

15. The method for manufacturing a semiconductor device as claimed in claim 11, wherein the wire pattern is fanned by metal plating.

16. The method for manufacturing a semiconductor device as claimed in claim 15, wherein the metal board is plated with a different metal from a metal which forms the metal board prior to the step of forming the wire pattern by the metal plating.

17. The method for manufacturing a semiconductor device as claimed in claim 11, wherein the wire pattern is formed by a conductive resin.

18. A method for manufacturing a semiconductor device comprising the steps of:

forming a wire pattern made of a conductive material on a metal board;

connecting an electronic part with the wire pattern;

fanning a resin housing in which the electronic part and the wire pattern are molded by encapsulating the electronic part and the wire pattern on the metal board;

removing the metal board from the resin housing; and attaching a functional part to the resin housing after the metal board is removed from the resin housing, the functional part providing a designated function in cooperation with a semiconductor element.

19. The method for manufacturing a semiconductor device as claimed in claim 18, wherein the functional part comprises a lens for photographing, the semiconductor element is a solid-state image sensing chip having a light-receiving surface, and the lens for photographing and the solid-state image sensing chip are arranged on the resin housing in a state where a light passing through the lens for photographing is incident on the light-receiving surface of the solid-state image sensing chip.

20. A semiconductor device for photographing comprising:

a lens holder having a lens for photographing;

a resin molded body providing the lens holder;

a solid-state image sensing chip mounted to a bottom surface of the resin molded body opposite to a surface on which the lens holder is mounted; and a board to which the resin molded body is mounted;

wherein the board has an opening positioned at a place where the resin molded body is mounted, and the solid-state image sensing chip is mounted to the bottom surface of the resin molded body in a state where the solid-state image sensing chip is arranged in the opening.

21. The semiconductor device for photographing as claimed in claim 20, further comprising a penetrating hole formed in the resin molded body, and wherein the lens for photographing of the lens holder faces a light receiving surface of the solid-state image sensing chip through the hole.

22. The semiconductor device for photographing as claimed in claim 20, further comprising an electrode which projects from a surface of the resin molded body on which the solid-state image sensing chip is mounted, wherein the resin molded body is mounted to the board via the electrode.

23. The semiconductor device for photographing as claimed in claim 22, further comprising an electrode pad and a wire pattern formed on the board and exposed on the surface of the resin molded body from which the electrode projects, and an electronic part molded in the resin molded body in a state where the electronic part is connected with the electrode pad.

24. The semiconductor device for photographing as claimed in claim 23, wherein the electronic part is connected with the electrode pad by a silver (Ag) paste.

25. The semiconductor device for photographing as claimed in claim 22, further comprising:

a dummy projection part which is formed on a surface of the resin molded body in a position corresponding to a vicinity of a corner of the board, the dummy projection part having the same structure as the electrode, but being electrically isolated, and an electrically isolated electrode pad provided on the board and connected to the electrically isolated dummy projection part.

26. The semiconductor device for photographing as claimed in claim 20, further comprising a reinforcement plate which is stuck to the board in an area where the resin mold body is mounted so as to reinforce the resin molded body.

27. A method for manufacturing a semiconductor device, comprising the steps of:

mounting a resin molded body, which has an electrode projecting from a bottom surface thereof, to a board via the electrode; and mounting a solid-state image sensing chip to the bottom surface of the resin molded body through an opening provided in the board, after connecting the resin molded body to the board via the electrode.

28. A semiconductor device for photographing comprising:

a resin housing provided with a functional part;

a wire pattern made of a conductive material and molded in the resin housing, a part of the wire pattern being exposed from the resin housing;

an image sensing chip connected to the part of the wire pattern exposed from the resin housing; and a semiconductor element for controlling provided to the resin housing and connected to the wire pattern, wherein the image sensing chip provides a photographing function in cooperation with the semiconductor element for controlling provided to the resin housing.

29. The semiconductor device for photographing as claimed in claim 28, wherein an electronic part is provided and molded in the resin housing, and the image sensing chip provides a photographing function in cooperation with the semiconductor element for controlling provided to the resin housing and the electronic part.

30. The semiconductor device for photographing as claimed in claim 28, wherein the semiconductor element for controlling is provided and molded in the resin housing.

31. The semiconductor device for photographing as claimed in claim 28, wherein the semiconductor element for controlling is connected to the part of the wire pattern exposed from the resin housing.

32. The semiconductor device for photographing as claimed in claim 31, wherein the semiconductor element for controlling is provided and molded in another resin housing different from the resin housing, and the other resin housing is provided to the resin housing in a state where the image sensing chip is put between the resin housing and the other resin housing.

33. The semiconductor device for photographing as claimed in claim 28, wherein the semiconductor element for controlling has a function controlling the image sensing chip.

34. A semiconductor device for photographing, comprising:

a lens holder having a lens for photographing;

a resin molded body providing the lens holder;

a solid-state image sensing chip mounted to a bottom surface of the resin molded body opposite to a surface on which the lens holder is mounted; and a board to which the resin molded body is mounted, wherein the board has an opening positioned at a place where the resin molded body is mounted, the solid-state image sensing chip is mounted to the bottom surface of the resin molded body in a state where the solid-state image sensing chip is arranged in the opening, and an underfill material is fills up between the resin molded body and the board.

35. The semiconductor device for photographing as claimed in claim 34, wherein the solid-state image sensing chip is fixed to the resin housing by supplying the under fill material filling up between the resin molded body and the board to a mount area of the solid-state image sensing chip.

36. A semiconductor device for photographing comprising:

a lens holder having a lens for photographing;

a resin molded body providing the lens holder;

a solid-state image sensing chip mounted to a bottom surface of the resin molded body opposite to a surface on which the lens holder is mounted; and a board to which the resin molded body is mounted, wherein the board has an opening positioned at a place where the resin molded body is mounted, the solid-state image sensing chip is mounted to the bottom surface of the resin molded body in a state where the solid-state image sensing chip is arranged in the opening, and the resin molded body is mounted to the board by an anisotropic conductive resin.

37. A semiconductor device for photographing, comprising:

a resin housing having an opening extending between an upper surface of the resin housing and a plane bottom surface of the resin housing;

a wire pattern made of a conductive material and molded in the resin housing, a part of the wire pattern being exposed on the plane bottom surface of the resin housing;

an electronic part connected with the wire pattern in a state where the electronic part is molded in the resin housing;

a solid-state image sensing chip that is flip chip mounted to the part of the wire pattern being exposed on the bottom surface of the resin housing;

a lens for photographing which is mounted on an upper face of the resin housing; and a board to which the resin housing is mounted, wherein the lens for photographing and the solid-state image sensing chip are arranged in a state where a light passing through the lens for photographing is incident on a light-receiving surface of the solid-state image sensing chip through the opening of the resin housing, and the wire pattern exposed on the bottom surface of the resin housing is electrically connected to a wire pattern of the board through a mount terminal made of metal.

38. The semiconductor device for photographing as claimed in claim 37, the mount terminal is a ball having solder as a main element.

39. The semiconductor device for photographing as claimed in claim 37, the mount terminal is a ball having gold as a main element.

40. A method for manufacturing a semiconductor device for photographing, comprising the steps of:

forming a wire pattern made of a conductive material on a plane surface of a metal board;

connecting an electronic part with the wire pattern;

forming a resin housing in which the electronic part and the wire pattern are molded by encapsulating the electronic part and the wire pattern on the metal board;

exposing a part of the wire pattern by removing the metal board from the resin housing;

forming a mount terminal on the part of the wire pattern exposed on the plane bottom surface of the resin housing;

mounting the resin housing on the board through the mount terminal;

flip chip mounting an image sensing chip to the wire pattern exposed on the bottom surface of the resin housing; and attaching a functional part to the resin housing, the functional part providing a photographing function in cooperation with the image sensing chip.

41. The method for manufacturing a semiconductor device for photographing as claimed in claim 40, further comprising the step of transcribing a solder paste to the mount terminal before the step of mounting the resin housing to the board.

42. The method for manufacturing a semiconductor device for photographing as claimed in claim 40, further comprising the step of applying a solder paste to the board before the step of mounting the resin housing to the board.

* * * * *